United States Patent
Ohsawa et al.

(10) Patent No.: US 6,260,179 B1
(45) Date of Patent: Jul. 10, 2001

(54) CELL ARRANGEMENT EVALUATING METHOD, STORAGE MEDIUM STORING CELL ARRANGEMENT EVALUATING PROGRAM, CELL ARRANGING APPARATUS AND METHOD, AND STORAGE MEDIUM STORING CELL ARRANGING PROGRAM

(75) Inventors: Keiko Ohsawa; Terunobu Maruyama, both of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/072,357

(22) Filed: May 5, 1998

(30) Foreign Application Priority Data

Oct. 23, 1997 (JP) .................................................. 9-290790

(51) Int. Cl.[7] .................................................. G06F 17/50
(52) U.S. Cl. ................................. 716/5; 8/10; 8/14; 8/15
(58) Field of Search ............................. 395/500.06; 716/5

(56) References Cited

U.S. PATENT DOCUMENTS

| | | | |
|---|---|---|---|
| 5,657,242 | * 8/1997 | Sekiyama et al. | 364/491 |
| 5,784,289 | * 7/1998 | Wang | 364/490 |
| 5,787,268 | * 7/1998 | Sugiyama et al. | 395/500 |
| 5,798,936 | * 12/1998 | Cheng | 364/489 |
| 5,801,960 | * 9/1998 | Takano et al. | 364/491 |
| 5,818,727 | * 10/1998 | Sekiguchi | 364/490 |
| 5,852,562 | * 12/1998 | Shinomiya et al. | 364/491 |
| 5,889,677 | * 3/1999 | Yasuda et al. | 364/488 |
| 5,926,397 | * 7/1999 | Yamanouchi | 364/491 |
| 5,978,572 | * 11/1999 | Toyonaga | 395/500.06 |

* cited by examiner

*Primary Examiner*—Matthew Smith
*Assistant Examiner*—A. M. Thomson
(74) *Attorney, Agent, or Firm*—Armstrong, Westerman, Hattori, McLeland & Naughton, LLP

(57) ABSTRACT

A cell arrangement evaluating method for predicting a wiring density based on only a cell arranging result prior to initiation of any wiring programs so as to easily perform wiring condition evaluation based on the wiring density within a short time. Two cells to be connected by wiring are selected, and a rectangular region is obtained in which the pins of the two cells to be connected are diagonal verfexes. The probability of wiring between the pins to be connected passing through a certain grid point of wiring grid is calculated. A proportion of the rectangular region occupying each evaluation unit grid is calculated, and then, for each evaluation unit grid, an index for an increase of a wiring density made by the factor of the wiring in the evaluation unit grid is calculated. Then, for each evaluation unit grid, the sum of indexes calculated for all the wiring lines among the cells as a wiring density in the evaluation unit grid is calculated. The cell arrangement evaluation method is used for designing an integrated circuit such an LSI or a circuit on a printed circuit board.

35 Claims, 16 Drawing Sheets

F I G. 10
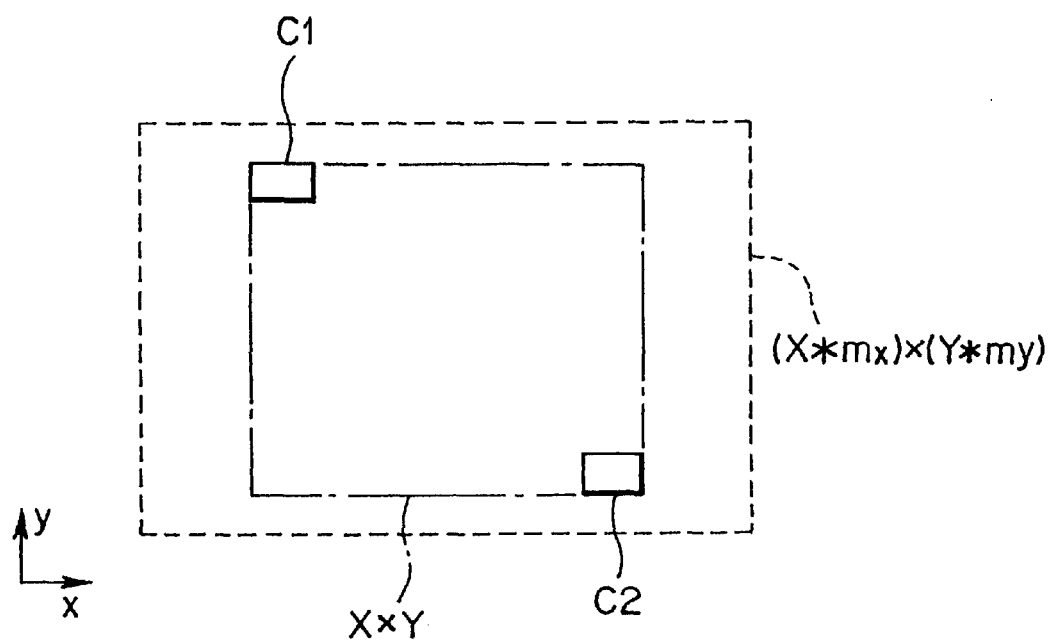

F I G. 11
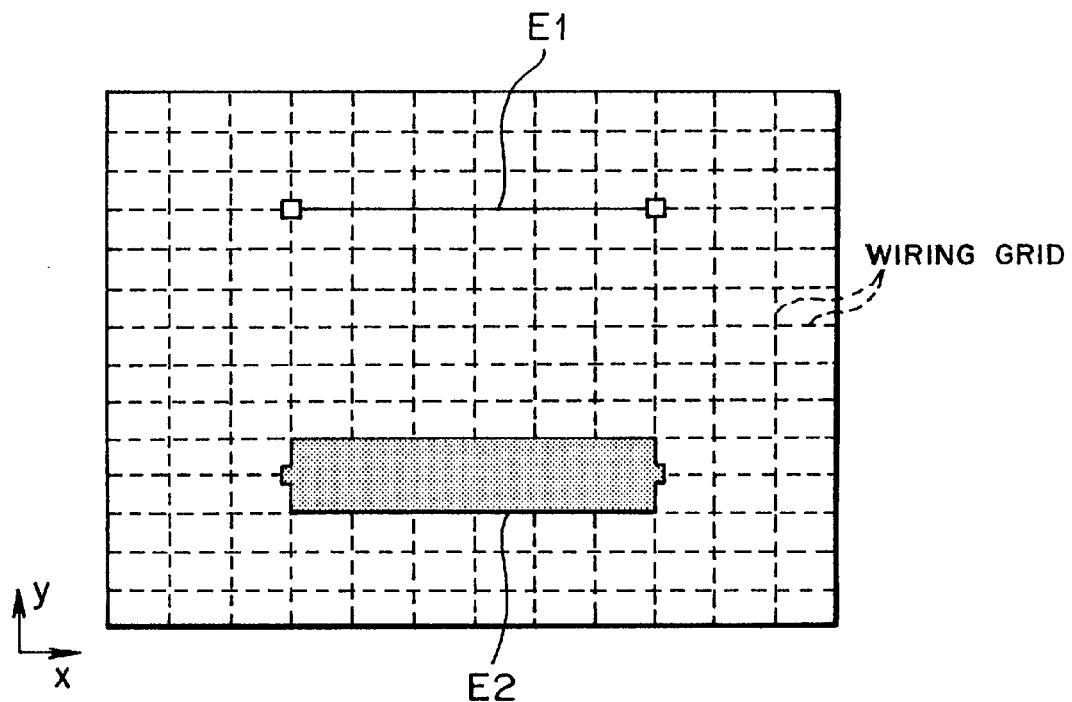

CELL ARRANGEMENT EVALUATING METHOD, STORAGE MEDIUM STORING CELL ARRANGEMENT EVALUATING PROGRAM, CELL ARRANGING APPARATUS AND METHOD, AND STORAGE MEDIUM STORING CELL ARRANGING PROGRAM

BACKGROUND OF THE INVENTION

1) Field of the Invention

The present invention relates to a technology for evaluating a wiring condition among cells disposed in a specified region, which is developed to decide arrangement of cells (circuit elements) for designing an integrated circuit such as an LSI or circuitry on a printed circuit board. More particularly, the invention relates to a method for predicting a wiring density among cells, a storage medium for storing a wiring density predicting program and a cell arranging device for arranging cells by using the wiring density predicting method.

2) Description of the Related Art

Generally, for designing an integrated circuit such as an LSI, first, logical designing is performed based on logical specifications which satisfy functions of an LSI to be designed. Then, packaging designing is performed based on a net list obtained by the logical designing. During packaging designing, cells (circuit elements) are arranged based on the net list and then wiring is performed among the cells.

A conventional interactive cell arranging system has used a procedure like that shown in FIG. 16 for arranging cells while evaluating a wiring condition.

The specific procedure goes as follows. First, cells are properly disposed in a specified region based on a net list (step S1). Then, for evaluating a wiring condition among the cells disposed in the specified region, a certain wiring program is started to perform temporary wiring (global wiring or Manhattan wiring) among the cells (step S2). Then, based on the result of the temporary wiring, a wiring density among the cells is determined and a wiring condition is evaluated (step S3).

If the cell arrangement is determined to be O.K. as a result of evaluating the wiring condition (YES route from step S4), the process proceeds to an actual wiring operation (step S6). On the other hand, if the wiring condition is not good (NO route from step S4), the cells are rearranged (step S5). Then, the process returns to step S2 and repeats the operations from step S2 to step S5. In this way, the cells are arranged in a good wiring condition (i.e., a condition for enabling real wiring to be quickly performed) before a real wiring operation is performed.

However, there is a problem inherent in the foregoing conventional interactive cell arranging system. Specifically, as described above with reference to FIG. 16, for evaluating a wiring condition among the cells disposed in the specified region, temporary wiring is performed by running a wiring program for each of the results of arranging in step S1 and step S5 and a wiring density is then obtained. Consequently, a great deal of time is required for temporary wiring processing.

Generally, considerable time is needed for wiring processing among cells, even for such easily estimated wiring as Manhattan wiring or the like. Especially, as a circuit is larger in size, more time is needed. As a result, if a wiring program is run for each rearranging of cells, a great deal of time is required for realizing cell arrangement of a good wiring condition and even circuit designing efficiency is greatly reduced.

SUMMARY OF THE INVENTION

The present invention was made in order to solve the problem discussed above. It is an object of the present invention to provide a wiring density predicting method, a storage medium for storing a wiring density predicting program and a cell arranging device, whereby circuit designing efficiency can be increased by predicting a cell wiring density only based on a cell arranging result without starting any wiring programs and easily making wiring evaluation based on the wiring density within a short time.

In order to achieve the objective, according to the present invention, the wiring density predicting method for predicting a wiring density among a number of cells disposed in a specified region for designing a circuit comprises the steps of dividing the specified region into a plurality of evaluation unit grids, selecting two cells to be connected by wiring, obtaining a rectangular region in which the pins of the two cells to be connected are diagonal vertexes, calculating probability of wiring between the pins of the two cells to be connected passing through one grid point of wiring grids in the rectangular region as wiring line passing probability by assuming that probability of the wiring between the pins of the two cells to be connected passing through each grid point of the wiring grids is uniform in the rectangular region, calculating a proportion of the rectangular region occupying each evaluation unit grid as a rectangular region occupancy ratio, calculating a value obtained by multiplying the wiring passing probability by the rectangular region occupancy ratio for each evaluation unit grid as a first wiring density influence value to be used as an index for a wiring density increase made by the wiring in the evaluation unit grid and calculating, for each evaluation unit grid, a sum of first wiring density influence values calculated for all wiring lines among a number of cells as a wiring density in the evaluation unit grid.

In this case, if a wiring inhibited region exists in the specified region, the process may take the steps of calculating a proportion of the wiring inhibited region occupying each evaluation unit grid as a wiring inhibited region occupancy ratio, calculating, by assuming that probability of wiring existence is 1 in the wiring inhibited region, a value obtained by multiplying the probability 1 by the wiring inhibited region occupancy ratio for each evaluation unit grid as a second wiring density influence value to be used as an index for a wiring density increase made by the wiring inhibited region in the evaluation unit grid and calculating, for each evaluation unit grid, a value obtained by adding the second wiring density influence value to the sum of the first wiring density influence values as a wiring density in the evaluation unit grid.

The process may also take the steps of calculating a proportion of each cell occupying each evaluation unit grid as a cell occupancy ratio, the cell being disposed in the specified region, calculating, for each evaluation unit grid, a value obtained by multiplying the cell occupancy ratio by a wiring direction ratio in the cell, the wiring direction ratio being preset for the cell, as a third wiring density influence value to be used as an index for a wiring density increase made by the cell in the evaluation unit grid and calculating, for each evaluation unit grid, a value obtained by adding the third wiring density influence value to the sum of the first wiring density influence values as a wiring density in the evaluation unit grid.

For determining the positions of the pins of the two cells to be connected so as to obtain the rectangular region, representative pin information registered in a cell library regarding the pins of the cells to be connected may be used. In a normal mode, all bits of pin information registered in the cell library regarding the pins of the cells to be connected may be used. In a high-speed mode, only representative pin information registered in the cell library regarding the pins of the cells to be connected may be used.

For obtaining the rectangular region, a size of the rectangular region may be adjusted based on a bypassing rate of a wiring route. Alternatively, the first wiring density influence value may be weighted based on a wire width according to a wiring variety.

Furthermore, if cell arrangement is changed after a wiring density among a number of cells is predicted and a wiring density is to be predicted again based on the changed cell arrangement, the process may take the steps of subtracting the first and third wiring density influence values calculated for the cell to be changed in arrangement before the arrangement change from a wiring density in the evaluation unit grid of the cell, calculating, for each evaluation unit grid, first and third wiring density influence values for the cell after the arrangement change and calculating, for each evaluation unit grid, a value obtained by adding the recalculated first and third wiring density influence values to the result of the subtraction as a wiring density in the evaluation unit grid.

According to the present invention, the storage medium is provided for storing a wiring density predicting program which is used to predict, for designing a circuit, a wiring density among a number of cells disposed in a specified region by a computer. Specifically, based on the wiring density predicting program, the computer executes the steps of dividing the specified region into a plurality of evaluation unit grids, selecting two cells to be connected by wiring, obtaining a rectangular region in which the pins of the two cells to be connected are diagonal vertexes, calculating probability of wiring between the pins of the two cells to be connected passing through one grid point of wiring grids in the rectangular region as wiring passing probability by assuming that probability of the wiring between the pins of the two cells to be connected passing through each grid point of the wiring grids is uniform in the rectangular region, calculating a proportion of the rectangular region occupying each evaluation unit grid as a rectangular region occupancy ratio, calculating, for each evaluation unit grid, a value obtained by multiplying the wiring passing probability by the rectangular occupancy ratio as a first wiring density influence value to be used as an index for a wiring density increase made by the wiring in the evaluation unit grid and calculating, for each evaluation unit grid, a sum of first wiring density influence values calculated for all wiring lines among a number of cells as a wiring density in the evaluation unit grid.

In this case, if a wiring inhibited region exists in the specified region, based on the wiring density predicting program, the computer may execute the steps of calculating a proportion of the wiring prohibited region occupying each evaluation unit grid as a wiring prohibited region occupancy ratio, calculating, by assuming that probability of wiring existence is 1 in the wiring inhibited region, a value obtained by multiplying the probability 1 by the wiring inhibited region occupancy ratio for each evaluation unit grid as a second wiring density influence value to be used as an index for a wiring density increase made by the wiring inhibited region in the evaluation unit grid and calculating, for each evaluation unit grid, a value obtained by adding the second wiring density influence value to the sum of the first wiring density influence values as a wiring density in the evaluation unit grid.

Furthermore, based on the wiring density predicting program, the computer may also execute the steps of calculating a proportion of each cell occupying each evaluation unit grid as a cell occupancy ratio, the cell being disposed in the specified region, calculating, for each evaluation unit grid, a value obtained by multiplying the cell occupancy ratio by a wiring direction ratio in the cell, the wiring direction ratio being preset for the cell, as a third wiring density influence value to be used as an index for a wiring density increase made by the cell in the evaluation unit grid and calculating, for each evaluation unit grid, a value obtained by adding the third wiring density influence value to the sum of the first wiring density influence values as a wiring density in the evaluation unit grid.

According to the present invention, the cell arranging device is provided for arranging cells in a specified region in an interactive manner for designing a circuit. Specifically, the cell arranging device comprises a display unit for displaying a cell arranging state in the specified region, a display control unit for controlling a displaying state in the display unit, an input unit for inputting response information for display data on the display unit or information necessary for cell arrangement, a cell arrangement processing unit for arranging a number of cells in the specified region based on a net list obtained by the information inputted from the input unit and logical design and a wiring density predicting unit for predicting, based on the result of cell arrangement made by the cell arrangement processing unit, a wiring density among a number of cells disposed in the specified region by the cell arrangement processing unit. The wiring density predicting unit includes a dividing section for dividing the specified region into a plurality of evaluation unit grids, a selecting section for selecting two cells to be connected by wiring, a rectangular region setting section for obtaining a rectangular region in which the pins of the two cells to be connected are diagonal vertexes, a wiring line passing probability calculating section for calculating probability of wiring between the pins of the two cells to be connected passing through each grid point of wiring grids in the rectangular region as wiring passing probability by assuming that probability of the wiring between the pins of the two cells to be connected passing through each grid point of the wiring grids is uniform in the rectangular region, a rectangular region occupancy rate calculating section for calculating a proportion of the rectangular region occupying each evaluation unit grid as a rectangular region occupancy ratio, a first influence value calculating section for calculating, for each evaluation unit grid, a value obtained by multiplying the wiring passing probability by the rectangular region occupancy ratio as a first wiring density influence value to be used as an index for a wiring density increase made by the wiring in the evaluation unit grid and a wiring density calculating section for calculating, for each evaluation unit grid, a sum of first wiring density influence values calculated for all wiring lines among a number of cells as a wiring density in the evaluation unit grid. The display control unit causes the display unit to display evaluation unit grids in the specified region and changes a display state in each evaluation unit grid displayed by the display unit stepwise according to the wiring density calculated by the wiring density calculating section for each evaluation unit grid.

In this case, the wiring density predicting unit may include a wiring inhibited region occupancy ratio calculating section for calculating, if a wiring inhibited region exists in the specified region, a proportion of the wiring inhibited region occupying each evaluation unit grid as a wiring inhibited region occupancy ratio, and a second influence calculating section for calculating, by assuming that probability of wiring existence in the wiring prohibited region is 1, a value obtained by multiplying the probability 1 by the wiring inhibited region occupancy ratio for each evaluation unit grid as a second wiring density influence value to be used as an index for a wiring density increase made by the wiring inhibited region in the evaluation unit grid. The wiring density calculating section may calculate, for each evaluation unit grid, a value obtained by adding the second wiring density influence value to the sum of the first wiring density influence values as a wiring density in the evaluation unit grid.

The wiring density predicting unit may also include a cell occupancy ratio calculating section for calculating a proportion of each cell occupying each evaluation unit grid as a cell occupancy ratio, the cell being disposed in the specified region, and a third influence value calculating section for calculating, for each evaluation unit grid, a value obtained by multiplying the cell occupancy ratio by a wiring direction ratio in the cell, the wiring density ratio being preset for the cell, as a third wiring density influence value to be used as an index for a wiring density increase made by the cell in the evaluation unit grid. The wiring density calculating section may calculate, for each evaluation unit grid, a value obtained by adding the third wiring density influence value to the sum of the first wiring density influence values as a wiring density in the evaluation unit grid.

For determining positions of the pins of the two cells to be connected so as to obtain the rectangular region, the rectangular region setting section may use representative pin information regarding the pins of the cells to be connected, which is registered in a cell library. In a normal mode, all bits of pin information registered in the cell library for the pins of the cells to be connected may be used. In a high-speed mode, only representative information registered in the cell library for the pins of the cells to be connected may be used.

For obtaining the rectangular region, the rectangular region setting section may adjust a size of the rectangular region based on a bypassing rate of a wiring route. Alternatively, the first influence value calculating section may weight the first wiring density influence value based on a wire width according to a wiring variety.

Furthermore, if cell arrangement is changed according to the result of wiring density prediction which has been made by the wiring density predicting unit and then the wiring density predicting unit predicts a wiring density again based on the changed cell arrangement, in the wiring density predicting unit, for the changed cell, the first and third wiring density influence values calculated before the arrangement change may be subtracted from a wiring density in the evaluation unit grid of the cell. Then, first and third wiring density influence values may be calculated for each evaluation unit grid of the cell after the arrangement change through the selecting section, the rectangular region setting section, the wiring passing probability calculating section, the rectangular region occupancy ratio calculating section, the first influence value calculating section, the cell occupancy ratio calculating section and the third influence value calculating section. Then, the wiring density calculating section may calculate, for each evaluation unit grid, a value obtained by adding the recalculated first and third wiring density influence values to the result of the foregoing subtraction as a wiring density in the evaluation unit grid.

If an evaluation unit grid on the display unit is selected by operating the input unit, the display control unit may display with emphasis cells existing in the selected evaluation unit grid, wiring lines passing through the evaluation unit grid and cells connected to the wiring line on the display unit. Further, if a list display flag is ON, the display control unit may display information regarding the cells and the wiring lines displayed with emphasis as a list on the display unit.

If an automatic display flag is ON, the display control unit may automatically display with emphasis cells existing in an evaluation unit grid having a wiring density equal to a preset reference value or higher, a wiring line passing through the evaluation unit grid and a cell connected to the wiring line on the display unit. The display control unit may also display information regarding the cells and the wiring line displayed with emphasis as a list on the display unit.

The cell arranging device of the present invention may be constructed such that the following data ① to ⑦ can be inputted/set as control parameters from the input unit in an interactive manner.

① Size of the evaluation unit grid
② The wiring direction ratio
③ Mode specifying flag for specifying which processing should be performed, the normal mode or the high-speed mode
④ Bypassing rate of the wiring route
⑤ Weighting based on a wire width according to the wiring variety
⑥ L display flag
⑦ Automatic display flag and reference value The effects and advantages of the wiring density predicting method, the storage medium for storing a wiring density predicting program and the cell arranging device of the present invention can be summarized as follows:

[1] A value (first wiring density influence value) of integrating probabilities of wiring for connecting cells passing through each evaluation unit grid is obtained as a wiring density predicting value for the evaluation unit grid. Based on this predicting value, a wiring density among a number of cells can be easily predicted within a very short time. Accordingly, since a wiring density can be predicted only based on the result of arranging the cells without starting any wiring programs during arranging of the cells, wiring condition evaluation can be easily made based on a wiring density within a very short time. Therefore, cell arrangement having a high wiring condition can be performed within a short time before actual wiring, a possibility of the need of rearranging the cells after actual wiring can be greatly reduced and very efficient circuit designing can be performed.

[2] A wiring density including factors of a wiring inhibited region and a cell inner structure can be estimated by adding, to the wiring density predicting value, the degrees of influence given to a wiring density of each evaluation unit grid by the factors of the wiring inhibited region and the cell inner structure respectively as second and third wiring density influence values. Accordingly, a wiring condition among the cells can be evaluated more surely and accurately.

[3] By using representative pin information registered in the cell library for determining the positions of the pins of two cells to be connected so as to obtain a rectangular region through which a wiring line for connecting the two cells may pass, the amount of data read from the cell library can be reduced and time required for obtaining a rectangular region can be shortened. Accordingly, prediction of a wiring density, in other words wiring condition evaluation, can be made at a higher speed.

[4] Setting is switched between the normal mode and the high-speed mode. In the normal mode, the positions of the pins to connected are determined by using all bits of pin information registered in the cell library regarding the pins to be connected. Accordingly, a wiring density can be accurately predicted. In the high-speed mode, since the positions of the pins to be connected by using only representative pin information, the amount of data read from the cell library can be reduced and time required for obtaining a rectangular region can be shortened. Accordingly, prediction of a wiring density, in other words, wiring condition evaluation, can be made at a higher speed.

[5] By greatly adjusting a rectangular region according to the bypassing rate of a wiring route for obtaining a rectangular region through which a wiring line for connecting the two cells may pass, a wiring density considering a region through which the wiring route may pass because of its bypassing can be estimated. Accordingly, a wiring condition among the cells can be evaluated more surely and accurately.

[6] A first wiring density influence value is weighted based on a wire width according to a wiring variety. Thus, since wiring line passing probability (first wiring density influence value) matching the size of a wire width can be calculated for special wiring used for clocks and power sources, the special wiring having a wire width larger than that of normal wiring, a wiring density including the factor of a wiring variety can be estimated. Accordingly, a wiring condition among the cells can be evaluated more surely and accurately.

[7] For predicting a wiring density again after the change of cell arrangement, old information (first and third wiring density influence values) calculated before the arrangement change, the information regarding the cell changed in arrangement, is subtracted from a wiring density in an evaluation unit grid for the cell. Then, new information calculated for the cell after the arrangement change is added to the result of the subtraction. In this way, a wiring density after the change of cell arrangement can be predicted again by a minimum calculation amount without recalculating a wiring density for all the cells. Since a wiring density can be quickly predicted after the arrangement change even if the cells are rearranged so as to perform cell arrangement having a high wiring condition before actual wiring, cell arrangement having a high wiring condition can be performed within a short time before actual wiring. Accordingly, efficiency of circuit designing can be greatly increased.

[8] By changing a display state in each evaluation unit grid displayed on the display unit stepwise according to a wiring density calculated for each evaluation unit grid, a circuit designer can determine, at a glance, a portion of the cell arrangement region having a high wiring density, in other words, a target region for cell rearrangement. Accordingly, a wiring density condition can be very easily evaluated.

[9] By displaying cells existing in an evaluation unit grid selected on the display unit, wiring lines passing through the evaluation unit grid and cells connected to the wiring lines on the display unit with emphasis, the circuit designer can use the display thereof as a basis for cell rearrangement determination. The circuit designer can also visually capture and determine the cells related with a portion having wiring line congestion (evaluation unit grid having a high wiring density), in other words, the cells to be considered for rearrangement.

In this case, with the foregoing emphasisdisplaying and by displaying information regarding the cells and the wiring lines displayed with emphasis as a list on the display unit, the circuit designer can quickly recognize particular information for specifying the cells and the wiring lines related with the wiring line congestion.

Accordingly, the circuit designer can quickly determine cell arrangement which largely contributes to the occurrence of wiring line congestion and move the arranged cells (cell rearrangement) for softening the wiring congestion very smoothly.

[10] If the automatic display flag is ON, by automatically displaying cells existing in an evaluation unit grid having a wiring density equal to a reference value or higher, wiring lines passing through the evaluation unit grid and cells connected to the wiring line on the display unit with emphasis and also, by automatically displaying information regarding the cells and the wiring lines displayed with emphasis as a list on the same, the circuit designer can visually capture and quickly determine the cells and the wiring lines related with the evaluation unit grid having a high degree of wiring line congestion (wiring density) on the display unit without selecting each evaluation unit grid on the same. The circuit designer can also quickly recognize particular information for specifying the cells and the wiring lines. Accordingly, the circuit designer can quickly determine cell arrangement which largely contributes to the occurrence of wiring line congestion and move the arranged cells (cell rearrangement) for softening the wiring line congestion very smoothly.

[11] The circuit designer can input/set the following control parameters from the input unit in an interactive manner: ① size of evaluation unit grid, ② wiring direction ratio in cell, ③ mode specifying flag, ④ bypassing rate of wiring route, ⑤ weighting based on wire width according to wiring variety, ⑥ list display flag and ⑦ automatic display flag and reference value. Accordingly, the circuit designer can properly set a wiring density calculation (prediction) condition, wiring condition evaluation reference and a processing speed (normal/high speed) and execute cell arrangement while making optimal wiring condition evaluation according to a situation.

BRIEF DESCRIPTION OF THE DRAWINGS

These and other objects, features and advantages of the present invention will become apparent upon reading of the following detailed description and drawings, in which:

FIG. 10 is a view illustrating adjustment of a rectangular region based on a bypassing rate of wiring route in the embodiment;

FIG. 11 is a view illustrating weighting based on a wire width according to a wiring variety in the embodiment;

DESCRIPTION OF THE PREFERRED EMBODIMENTS

Next, the preferred embodiment of the present invention will be described with reference to the accompanying drawings.

Figure 1:
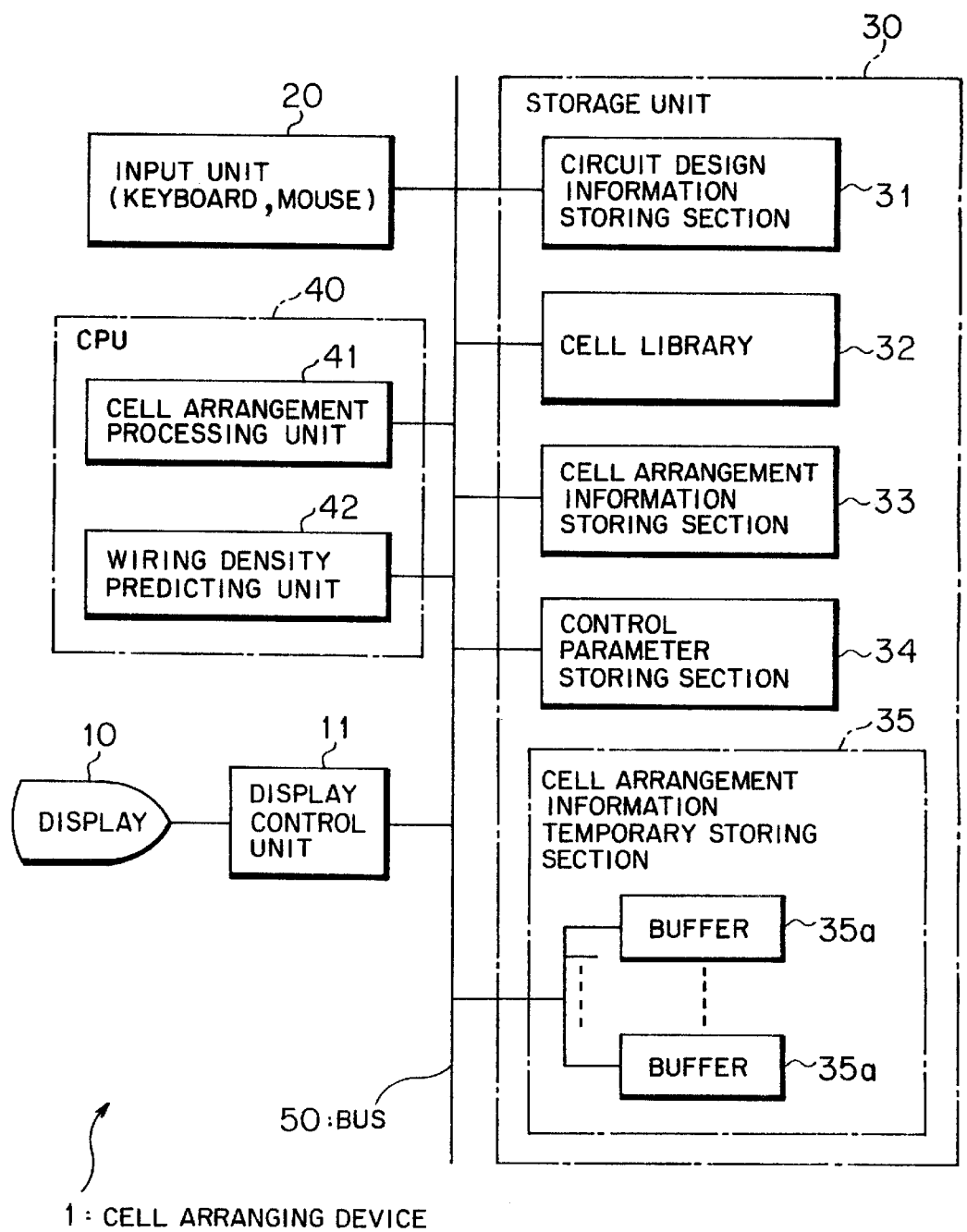
FIG. 1 is a block diagram showing entire functional constitution of a cell arranging device of an embodiment of the present invention.

Referring to FIG. 1 which is a block diagram, there is shown an entire functional constitution of the cell arranging device of the embodiment of the present invention. As shown in FIG. 1, the cell arranging device 1 of the embodiment arranges a number of cells (circuit elements such as flip-flops or RAMS) in a specified cell arranging region in an interactive manner for designing an integrated circuit such as an LSI. The cell arranging device 1 comprises a general processing unit (processor or computer) which includes a display (display unit) 10, a display control unit 11, an input unit 20, a storage unit 30 and a CPU 40.

In the embodiment, the display 10 displays the state of arranging the cells (result of arranging by a later-described cell arrangement processing unit 41) in the cell arranging region and information (result of predicting by a later-described wiring density predicting unit 42) regarding a wiring density. The display control unit 11 controls the state of displaying on the display 10. Specifically, the display control unit 11 controls the state of displaying on the display 10 by performing later-described various display control operations according to an instruction from the CPU 40 (cell arrangement processing unit or wiring density predicting unit 42) or the input unit 20.

The input unit 20 includes, for example a keyboard and a mouse which are operated by an operator (circuit designer). The input unit 20 inputs information regarding a response to display data on the display 10 and various bits of information necessary for cell arrangement and regarding wiring density prediction (instruction information or the like for later-described control parameters and evaluation unit grids). Accordingly, the operator can arrange the cells and display wiring density information in an interactive manner by operating the input unit 20 so as to input various bits of information while referring to a display on the display 10.

The storage unit 30 includes in practice, in addition to a RAM and a ROM usually installed in a processing unit, an external storage device such as a disk drive which is connected to the processing unit (cell arranging device 1). The storage unit 30 is a generic term for indicating portions of the cell arranging device 1 of the embodiment for storing various bits of information. Specifically, the storage unit 30 includes such functional elements as a circuit design information storing section 31, a cell library 32, a cell arrangement information storing section 33, a control parameter storing section 34 and a cell arrangement temporary storing section 35. The foregoing RAM, ROM and external storage device function as the storing sections 31 and 33 to 35 and the cell library 32. Further, the storage unit 30 stores cell arranging and wiring density predicting programs (described later) which are installed from the outside.

The circuit design information storing section 31 stores a net list obtained by logical designing, the position (i.e., original point position or rotational code) of a cell arranging region (specified region), information [number of wiring layers or wiring direction in each wiring layer (only x direction, only y direction or both x and y directions)] regarding a wiring layer in the cell arranging region and information (wiring layer or position where a wiring inhibited region exists) regarding a wiring inhibited region. The net list includes an input signal, an output signal and a cell connection relationship between these signals as information. The net list is used for automatic arrangement or automatic wiring in the integrated circuit.

The cell library 32 stores, for each cell variety, information regarding cells to be arranged for designing the integrated circuit. The cell library 32 registers, as information regarding each cell (information regarding cell inner structure), for example, information regarding a wiring pattern in each cell (used wiring layer or wiring position), a cell shape or size (area), and so on. The details of information regarding a wiring pattern in a cell, in other words pin information, will be described later by referring to FIG. 9.

The cell arrangement information storing section 33 stores cell arrangement information obtained as a result of arranging the cells by the later-described cell arrangement processing unit 41, in other words the positions of all the cells as constituting elements of the integrated circuit to be designed in the specified cell arranging region.

The control parameter storing section 34 stores various control parameters (value necessary for wiring density prediction processing or information for instructing the state of displaying a predicting result) inputted from the input unit 20 in the interactive manner by the operation of the operator. As control parameters, the following data ① to ⑦ are inputted/set from the input unit 20 in an interactive manner and then registered in the control parameter storing section 34.

① Size (see FIG. 8) of an evaluation unit grid used as a basic unit for obtaining a specified cell arranging region by division/partition as described later. The size of the evaluation unit grid is set as a length of sides of two wiring directions x and y.

② Wiring direction ratio (x direction wiring ratio is $d_x$, and y direction wiring ratio is $d_y=1-d_x$)in a wiring layer (used layer) used by a wiring line (pin) in the cell.

③ Mode specifying flag (0/1) for specifying one selected from a normal processing mode and a high-speed processing mode.

④ Bypassing rates $m_x$ and $m_y$ ($m_x \geq 1$ and $m_y \geq 1$; see FIG. 10) of x and y directions.

⑤ Weighting amount b based on a wire width according to a special net variety used, as described later, for calculating first wiring density influence values $P_x$ and $P_y$. In practice, a weighting rate is usually a wire width rate with respect to a wiring width. For its value, for example, 1 is set for a normal wiring line, 2 for a clock wiring line, 4 for a power supply wiring line, and so on (see FIG. 11).

Figure 14:
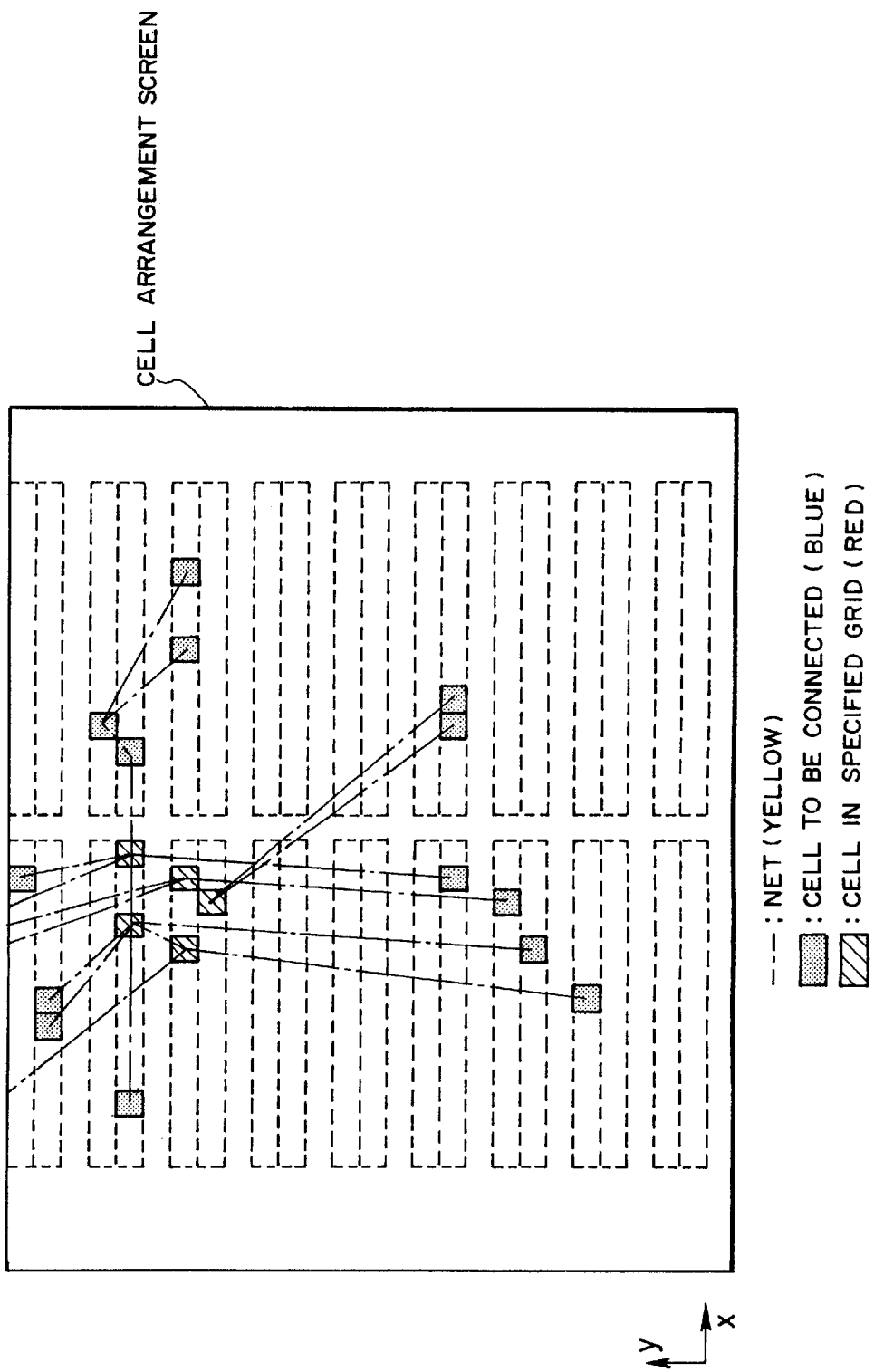
FIG. 14 is a view showing an example of displaying cells and nets with emphasis in the embodiment.
Figure 15:
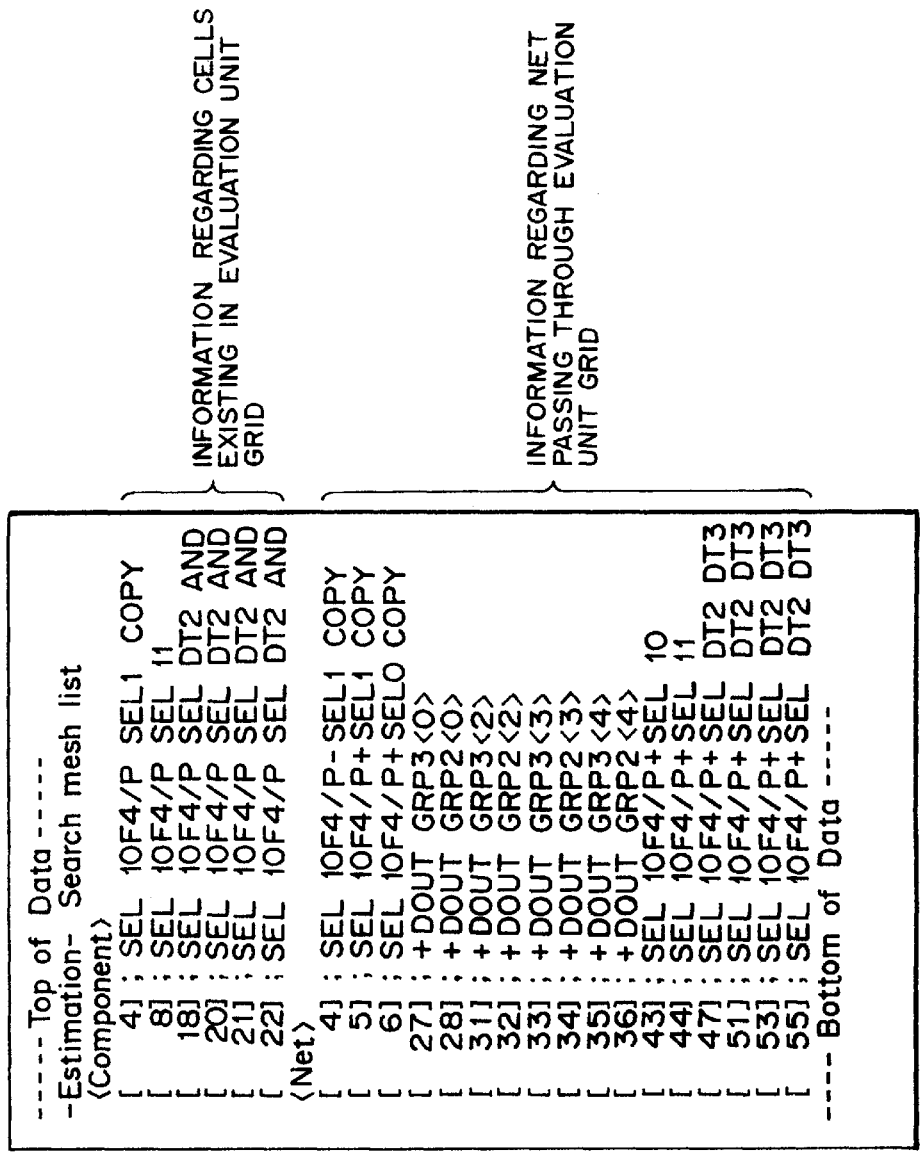
FIG. 15 is a view showing an example of displaying information regarding the cells and the nets as a list in the embodiment.
Figure 16:
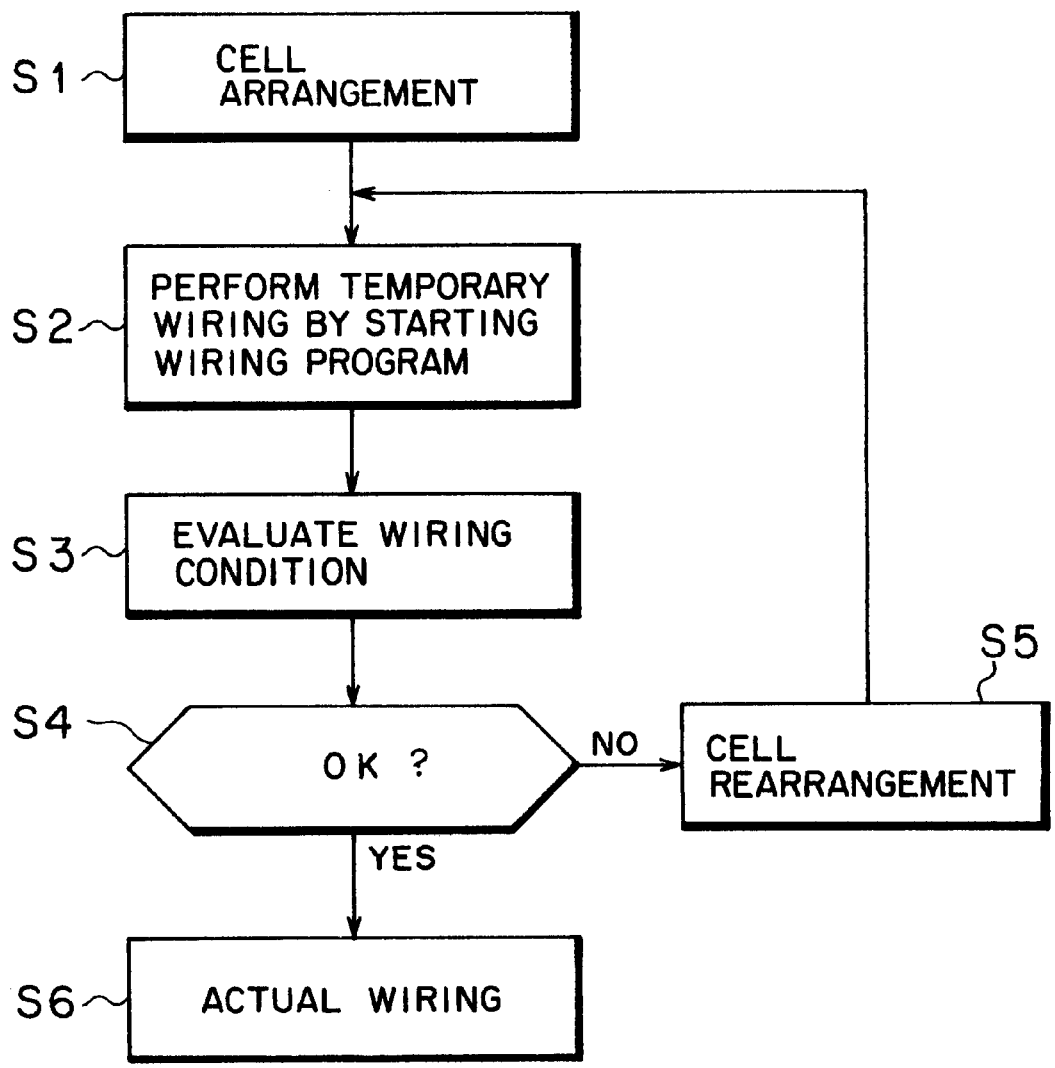
FIG. 16 is a flowchart illustrating a cell arranging procedure and a wiring condition evaluating method which have conventionally been practiced.

⑥ List display flag (0/1) for displaying, if the operator selects a particular evaluation unit grid while the result of predicting a wiring density is displayed on the display 10, a cell or the like concerned with the grid with emphasis (see FIG. 14) and simultaneously specifying whether information regarding the cell or the like should be displayed as a list or not (see FIG. 15).

⑦ Automatic display flag (0/1) and its reference value. The automatic display flag is used for specifying whether emphasis displaying of a cell or the like existing in an evaluation unit grid having a wiring density equal to the reference value or higher (see FIG. 14) and list displaying of information regarding the cell or the like (see FIG. 15) should be automatically performed or not simultaneously when wiring density prediction/calculation is performed.

The cell arrangement information temporary storing section 35 includes a plurality of buffers 35a. The cell arrangement information temporary storing section 35 temporarily holds, in each of the buffers 35a, information regarding cell arrangement in a region specified by a store cell command, the cell arrangement having been made by the later-described cell arrangement processing unit 41. Cell arrangement information held in each buffer 35a is read therefrom if selection is made by a re-store cell command.

The CPU 40 is in general control of the cell arranging device 1 and executes various operations. Especially, according to the embodiment, the CPU 40 functions as the cell arrangement processing unit 41 and the wiring density predicting unit 42.

The cell arrangement processing unit 41 arranges a number of cells in a specified cell arranging region in an interactive manner with the operator based on the net list stored in the circuit design information storing section 31, the cell information stored in the cell library 32 and the information (response information for display data on the display 10 and various bits of information necessary for cell arrangement) inputted from the input unit 20 by the operator. The result of arranging all the cells in the cell arranging region is stored as cell arrangement information in the cell arrangement information storing section 33.

In practice, the function of the cell arrangement processing unit 41 is realized as the operation of the CPU 40 by reading a cell arranging program in a RAM or the like, the program having been installed in the cell arranging device 1 (storage unit 30) from a recording medium such as a hard disk, a magnetic tape, a floppy disk, an optical disk, an optical magnetic disk or a CD-ROM, and executing the program by the CPU 40.

According to the embodiment, if the operator operates the input unit 20 to input the store cell command during a cell arranging operation performed by the cell arrangement processing unit 41, information regarding cells arranged in a region specified by the operator on a cell arrangement screen displayed on the display 10 is temporarily stored in the buffer 35a of the cell arrangement information temporary storing section 35. On the other hand, if the operator operates the input unit 20 to input the re-store cell command, cell arrangement information is read from the buffer 35a specified by the command and cells in the specified region are automatically rearranged in a state according to the read cell arrangement information.

The wiring density predicting unit 42 predicts a wiring density among a number of cells arranged in the specified cell arranging region by the cell arrangement processing unit 41 based on various bits of information stored in the circuit design information storing section 31, the cell library 32 and the control parameter storing section 34 in addition to the result of arranging the cells (cell arrangement information stored in the cell arrangement information storing section) by the cell arrangement processing unit 41.

In practice, as in the case of the function of the cell arrangement processing unit 41, the function of the wiring density predicting unit 42 is realized as the operation of the CPU 40 by reading a wiring density predicting program in a RAM or the like, the program having been installed in the cell arranging device 1 (storage unit 30) from a recording medium such as a hard disk, a magnetic tape, a floppy disk, an optical disk, an optical magnetic disk or a CD-ROM, and executing the program by the CPU 40. According to the embodiment, based on the wiring density predicting program, the CPU (computer) 40 functions as each of constituting elements denoted by reference numerals 60 to 70 shown in FIG. 2 in order to predict a wiring density among a number of cells arranged in the specified cell arranging region.

Figure 2:
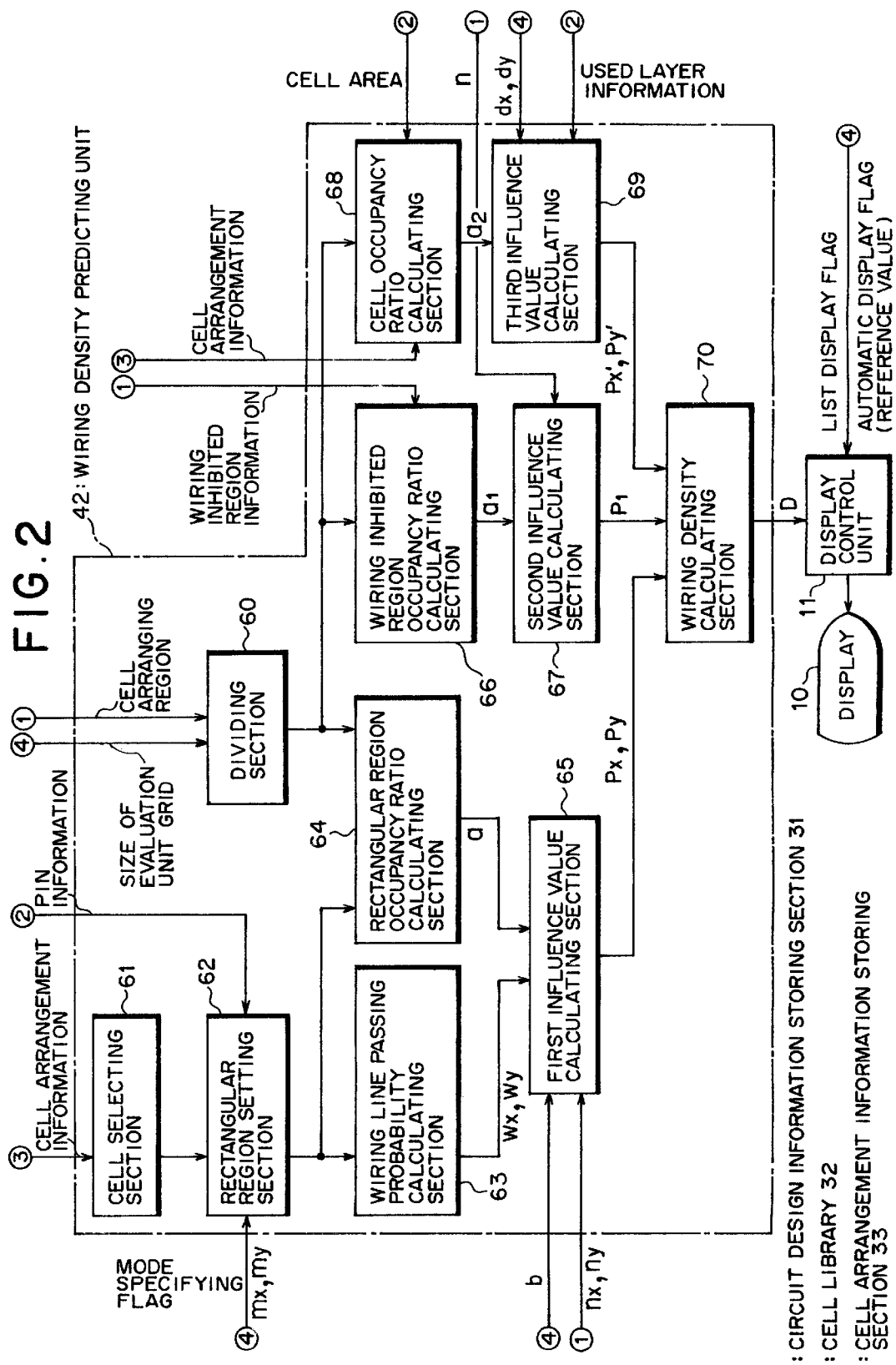
FIG. 2 is a block diagram showing in detail functional constitution of a wiring density predicting unit of the embodiment.

Referring to FIG. 2 which is a block diagram, there is shown in detail a functional constitution of the foregoing wiring density predicting unit 42. As shown in FIG. 2, the wiring density predicting unit 42 of the embodiment includes a dividing section 60, a cell selecting section 61, a rectangular region setting section 62, a wiring line passing probability calculating section 63, a rectangular region occupancy ratio calculating section 64, a fist influence value calculating section 65, a wiring inhibited region occupancy ratio calculating section 66, a second influence value calculating section 67, a cell occupancy ratio calculating section 68, a third influence value calculating section 69 and a wiring density calculating section 70.

The dividing section 60 divides the specified cell arranging region into a plurality of evaluation unit grids (search grids) based on a size (foregoing data ①) registered in the control parameter storing section 34. A specific dividing example will be described later by referring to FIG. 8.

The selecting section 61 selects, by referring to the cell arrangement information storing section 33, two cells to be connected by wiring from a number of cells arranged in the specified cell arranging region.

The rectangular region setting section 62 obtains a rectangular region in which the pins of the two cells to be connected, the cells having been selected by the selecting section 61, are diagonal vertexes. In this case, if the normal mode is selected/set by the mode specifying flag of the control parameter storing section 34, all bits of pin information regarding the pins to be connected are read from the cell library 32. Then, a rectangular region is obtained by using all the bits of pin information. On the other hand, if the high-speed mode is selected/set by the mode specifying flag, only representative pin information regarding the cells to be connected is read from the cell library 32. Then, a rectangular region is obtained by using the representative pin information. As described later by referring to FIG. 9, obtaining of the rectangular region by reading only the representative pin information enables processing to be performed at a higher speed compared with obtaining of the rectangular region by reading all the bits of pin information.

The rectangular region setting section 62 also has a function of adjusting the size of the obtained rectangular region based on the bypassing rates $m_x$, and $m_y$ of the wiring routes registered in the control parameter storing section 34. The details of such a function will be described later by referring to FIG. 10. The length of the two sides of the x and y directions of the rectangular region is multiplied by the bypassing rates $m_x$ and $m_y$ and thereby the size of the rectangular region is adjusted. If no bypassing occurs in the wiring route, the bypassing rates $m_x$ and $m_y$ are both set to 1.

The wiring line passing probability calculating section 63 assumes, as described later by referring to FIG. 8, that the probability of a wiring line passing through each grid point of a wiring grids is uniform in the rectangular region set by the rectangular region setting section 62, the wiring line being laid between the two cells to be connected. Then, the wiring line passing probability calculating section 63 calculates the probability of the wiring line between the two cells to be connected passing through one grid point of the wiring grid in the rectangular region (probability of reaching the grid point from the x direction is $W_x$ and probability of reaching the same from the y direction is $W_y$) as wiring line passing probability.

The rectangular region occupancy ratio calculating section 64 calculates, as described later by referring to FIG. 8, the proportion (area ratio) of the rectangular region occupying each evaluation unit grid as a rectangular region occupancy ratio a.

The first influence value calculating section 65 calculates, for each evaluation unit grid, a first wiring density influence value to be used as an index for the degree of wiring density increase made by the wiring line between the currently selected two cells in the evaluation unit grid. Specifically, the first influence value calculating section 65 uses the following expressions (1) and (2) for calculating first wiring density influence values $P_x$ and $P_y$ respectively corresponding to the wiring directions x and y based on the wiring line passing probabilities $W_x$ and $W_y$ calculated by the wiring line passing probability calculating section 63, the rectangular region occupancy ratio a calculated by the rectangular region occupancy ratio calculating section 64, the wire width rate b corresponding to the current wiring net variety, which has been read from the control parameter storing section 34, and the number $n_x$ of x direction wiring layers and the number $n_y$ of y direction wiring layers read from the circuit design information storing section 31. In the expressions, * means multiplication.

$$P_x = W_x * a * (1/n_x) * b \quad (1)$$

$$P_y = W_y * a * (1/n_y) * b \quad (2)$$

The wiring inhibited region occupancy ratio calculating section 66 calculates, if a wiring inhibited region exists in the specified cell arranging region, the proportion (area ratio) of the wiring inhibited region occupying each evaluation unit grid as a wiring inhibited region occupancy ratio $a_1$. In this case, information regarding the wiring inhibited region is read from the circuit design information storing section 31.

The second influence value calculating section 67 assumes that the probability of wiring existence in the wiring inhibition area is 1. Then, based on the foregoing assumption, the second influence value calculating section 67 calculates, for each evaluation unit grid, a second wiring density influence value to be used as an index for the degree of wiring density increase made by the wiring inhibited region. Specifically, the second influence value calculating section 67 uses the following expression (3) for calculating a second wiring density influence value $P_1$ based on the wiring inhibited region occupancy ratio $a_1$ calculated by the wiring inhibited region calculating section 66 and the number n of wiring layers for laying wiring lines in the inhibited wiring directions (x and y) in the wiring inhibited region.

$$P_1 = 1 * a_1 * (1/n) \quad (3)$$

The cell occupancy ratio calculating section 68 calculates, based on information read from the cell arrangement information storing section 33 and the area of each cell read from the cell library 32, the proportion (area ratio) of each cell occupying each evaluation unit grid, the cell having been arranged in the specified cell arranging region, as a cell occupancy ratio $a_2$.

The third influence value calculating section 69 calculates, for each evaluation unit grid, a third wiring density influence value to be used as an index for the degree of wiring density increase made by each cell inner structure (wiring pattern and pin) in the evaluation unit grid. Specifically, the third influence value calculating section 69 uses the following expressions (4) and (5) for calculating third wiring density influence values $P_x'$ and $P_y'$ respectively corresponding to the wiring directions x and y based on the cell occupancy ratio $a_2$ calculated by the cell occupancy ratio calculating section 68, information regarding a layer used in each cell, which has been read from the cell library 32, and wiring direction ratios $d_x$ and $d_y$ read from the control parameter storing section 34.

$$P_x' = a_2 * d_x \quad (5)$$

$$P_y' = a_2 * d_y \quad (6)$$

The wiring density calculating section 70 calculates, for each evaluation unit grid, the sum of the first wiring density influence values $P_x$ and $P_y$ respectively calculated for all the wiring lines among a number of cells, the second wiring density influence value $P_1$ calculated for the wiring inhibited region and the third wiring density influence values $P_x'$ and $P_y'$ calculated for the cell inner structure as a wiring density D in the evaluation unit grid.

However, for calculating an x direction wiring density, the influence values $P_x$, $P_1$ and $P_x'$ calculated for the x direction must be integrated for each evaluation unit grid. For calculating a y direction wiring density, the influence values $P_y$, $P_1$ and $P_y'$ calculated for the y direction must be integrated for each evaluation unit grid. For calculating wiring density of both x and y directions, all the influence values $P_x$, $P_y$, $P_1$, $P_x'$ and $P_y'$ must be integrated for each evaluation unit grid.

According to the embodiment, if after the wiring density predicting unit 42 predicts a wiring density D for each evaluation unit grid, cell arrangement is changed according to the result of predicting the wiring density D and the wiring density predicting unit 42 predicts a wiring density D again based on the cell arrangement after the change, the process goes as follows.

In the wiring density predicting unit 42, for the cell changed in arrangement, the first wiring density influence values $P_x$ and $P_y$ and the third wiring density influence values $P_x'$ and $P_y'$ calculated before the arrangement change are subtracted from the wiring density D of the evaluation unit grid concerned with the cell. Then, for the cell after the arrangement change, first wiring density influence values $P_x$ and $P_y$ and third wiring density influence values $P_x'$ and $P_y'$ are calculated for each evaluation unit grid by the foregoing elements including the selecting section 61, the rectangular region setting section 62, the wiring line passing probability calculating section 63, the rectangular region occupancy ratio calculating section 64, the first influence value calculating section 65, the cell occupancy ratio calculating section 68 and the third influence value calculating section 69. Then, the wiring density calculating section 70 calculates, for each evaluation unit grid, a value obtained by adding the recalculated first and third influence values $P_x$, $P_y$, $P_x'$ and $P_y'$ to the result of the foregoing subtraction as a wiring density D in the evaluation unit grid. A specific example of such a procedure for re-predicting a wiring density D will be described later by referring to FIG. 12.

The display control unit 11 of the embodiment includes the following display control functions (a) to (c) for displaying the wiring density D predicted by the wiring density predicting unit 42 on the display 10.

Figure 13:
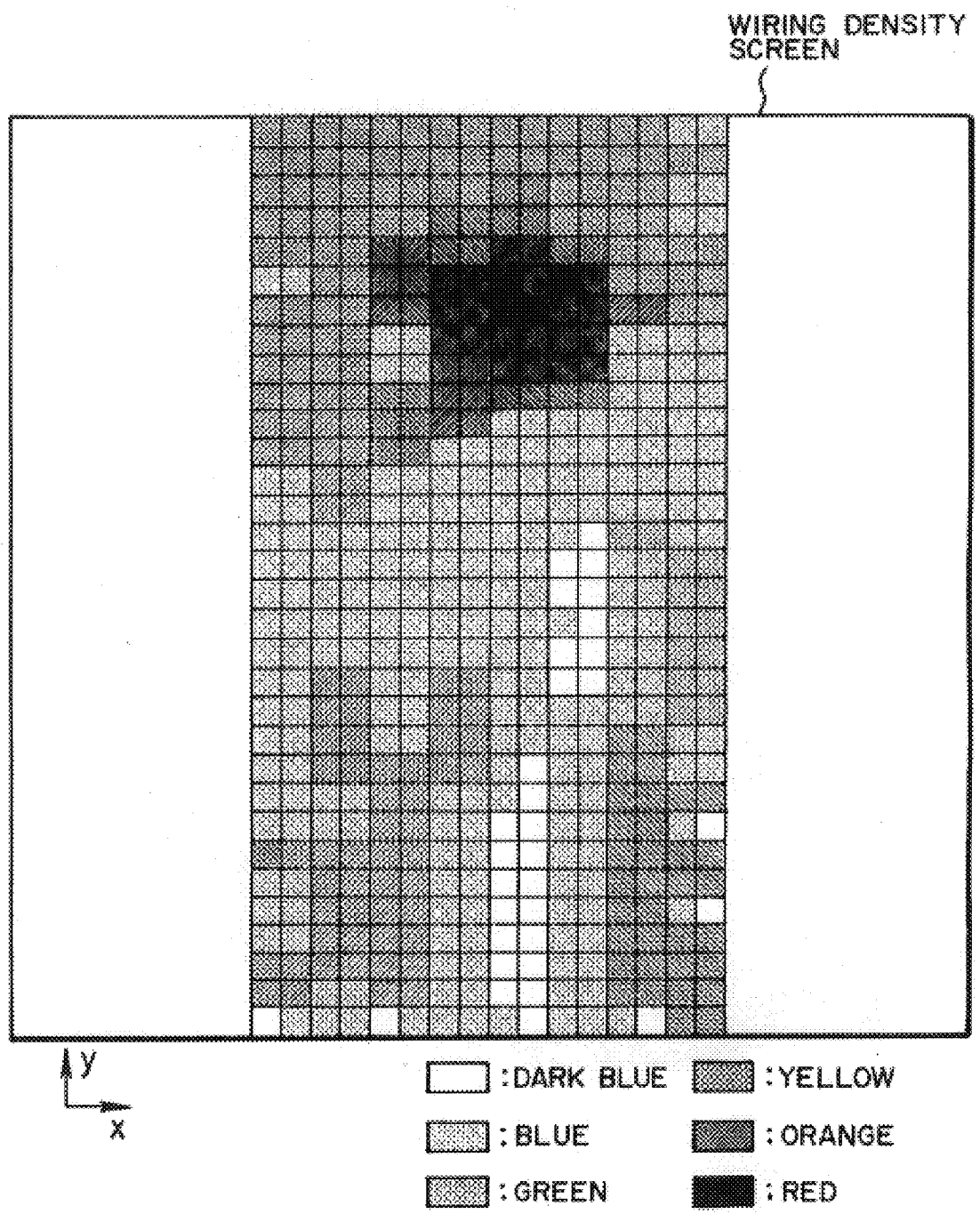
FIG. 13 is a view showing an example (example of wiring density screen) of stepwise displaying of a wiring density in the embodiment.

(a) The display control unit 11 controls the display 10 to display evaluation unit grids in the specified cell arranging region and, as shown in FIG. 13, changes a display state in each evaluation unit grid displayed on the display 10 stepwise according to a wiring density D calculated by the wiring density calculating section 70 for each evaluation unit grid. Specifically, by dividing the evaluation unit grids by color according to wiring densities D and displaying the same, the display control unit 11 displays, on the display 10, the result of predicting a wiring density in the specified cell arranging region. A wiring density to be displayed on the display 10 can be selected from any of a wiring density of only an x direction, a wiring density of only a y direction and a wiring density of both x and y directions (mixture of x and y directions).

(b) If the operator operates the input unit 20 to select a particular evaluation unit grid on the wiring density screen (see FIG. 13) of the display 10, as shown in FIG. 14, the display control unit 11 displays cells existing in the selected evaluation unit grid, a net (wiring lines) passing through this evaluation unit grid and cells connected to the net on the display 10 with emphasis. Specifically, the display control unit 11 performs displaying by using a color different from those of other portions or highlighting. In this case, if the list display flag of the control parameter storing section is ON, as shown in FIG. 15, information (cell name, net name, and so on) regarding the cells and the net which have been displayed with emphasis are displayed on the display 10 as a list.

(c) If the automatic display flag of the control parameter storing section 34 is ON, the display control unit 11 calculates a wiring density D for each evaluation unit grid and simultaneously displays cells existing in an evaluation unit grid having a wiring density equal to a preset reference value or higher, a net (wiring lines) passing through this evaluation unit grid and cells connected to the net on the display 10 with emphasis automatically. Then, information (cell name, net name, and so on) regarding the cells and the net which have been displayed with emphasis are displayed on the display 10 as a list.

Next, the operation of the cell arranging device 1 of the embodiment constructed in the foregoing manner will be described by referring to FIGS. 3 to 15.

First, by referring to a flowchart (step S11 to S24) shown in FIG. 3, a procedure for performing cell arrangement by the cell arranging device of the embodiment will be described.

The operator operates the input unit 20 to specify/input the foregoing control parameters ① to ⑦ in an interactive manner. Then, these parameters are registered in the control parameter storing section 34. Also, information necessary for cell arrangement processing is inputted (step S11). If there is no specification made regarding the control parameters ① to ⑦, wiring density prediction processing is performed by using a default value registered in the control parameter storing section 34 beforehand.

Then, the cell arrangement processing unit 41 (cell arranging program) is actuated. A number of cells are arranged in a specified cell arranging region in an interactive manner with the operator based on a net list stored in the circuit design information storing section 31, cell information stored in the cell library 32 and information (information regarding response to display data on the display 10 and various bits of information necessary for cell arrangement) inputted from the input unit 20 by the operator. The result of arranging all the cells in the specified cell arranging region is stored in the cell arrangement information storing section 33 as cell arrangement information (step S12).

After the cell arrangement processing unit 41 has arranged the cells in the specified cell arranging region, the wiring density predicting unit 42 (wiring density predicting program) is actuated. A wiring density among the cells is predicted based on the result of cell arrangement (cell arrangement information stored in the cell arrangement information storing section 33) and various bits of information stored in the circuit design information storing section 31, the cell library 32 and the control parameter storing section 34. Then, the result of the prediction is displayed on display 10 (step S13). A procedure for wiring density prediction and displaying will be described later by referring to FIGS. 4 to 7.

Then, the operator operates the input unit 20 so as to determine whether a particular evaluation unit grid has been selected on the wiring density screen (see FIG. 13) of the display 10 or not (step S14), whether a region has been specified on the cell arrangement screen of the display 10 and a store cell command has been inputted or not (step S18), whether a re-store cell command has been inputted or not (step S20) and whether a cell arrangement change command for changing the arrangement positions of the cells has been inputted on the cell arrangement screen of the display 10 or not (step S22).

If selection of a particular evaluation unit grid on the wiring density screen (see FIG. 13) of the display 10 is determined (YES route from step S14), as shown in FIG. 14, the display control unit 11 then displays cells existing in the selected evaluation unit grid, a net (wiring lines) passing through this evaluation unit grid and cells connected to the net on the display 10 with emphasis (step S15).

At this time, determination is made as to whether the list display flag of the control parameter storing section 34 has been set ON or not (step S16). If ON setting is determined (YES route), as shown in FIG. 15, information (cell name, net name, and so on) regarding the cell and the net displayed with emphasis are then displayed in another window on the display 10 (step S17).

If inputting of a store cell command is determined (YES route from step S18), the information regarding the cell arrangement in a region specified by the operator on the cell arrangement screen displayed on the display 10 is then saved/stored temporarily in the buffer 35*a* of the cell arrangement information temporary storing section 35 (step S19).

If inputting of a re-store command is determined (YES route from step S20), the temporarily stored cell arrangement information selected by the re-store command is then read from the buffer 35*a* of the cell arrangement temporary storing section 35. Then, the cell arrangement processing unit 41 automatically rearranges the cells in the specified region in a state according to the read cell arrangement information (step S21). Then, for the result of the cell rearrangement, wiring density prediction and displaying are performed again (step S13).

If inputting of a cell arrangement change command is determined (YES route from step S22), the cell arrangement processing unit 41 then performs, based on the command, movement/rearrangement/arrangement change of the cells in the specified cell arranging region (step S23). Then, for the result of the cell rearrangement, wiring density prediction and displaying are performed again (step S13).

If NO determination is made in all of steps S14, S18, S20 and S22 and a processing end is determined in step S24 (YES route), the cell arrangement processing is finished. If NO determination is made in step S24, the process then returns to step S14 and waits for grid selection and inputting of various commands.

As apparent from the foregoing, according to the embodiment, for cell arrangement processing, by specifying a region on a cell arrangement screen and inputting a store cell command, the cells arranged in the specified region and information regarding arrangement thereof can be saved in the buffer 35a. After saving of the cell arrangement information, even if the cells in the region are moved or placed in a non-arrangement state, the cell arrangement information can be read from the buffer 35a by inputting a re-store cell command. Then, based on the cell arrangement information, the cell arrangement in the specified region can be returned to its original state. As shown in FIG. 1, a plurality of buffers 35a for temporarily saving the cell arrangement information of the specified region are provided. Accordingly, these buffers 35a can temporarily save bits of cell arrangement information of a plurality of specified regions.

Furthermore, according to the embodiment, while partially saving cell arrangement information by a store cell command and reproducing cell arrangement by a re-store command, cell arrangements of plural kinds can be performed and these cell arrangements can be simultaneously displayed on the display 10. Also, as described later, since a plurality of wiring density screens can be displayed on the display 10, wiring densities for the cell arrangements of plural kinds can be simultaneously displayed on the display 10. Accordingly, the operator can select optimal cell arrangement by referring to the display of these wiring densities.

Next, wiring density prediction and displaying performed in step S13 of FIG. 3 will be described in detail by referring to flowcharts shown in FIGS. 4 to 7 and also FIGS. 8 to 15.

Figure 4:
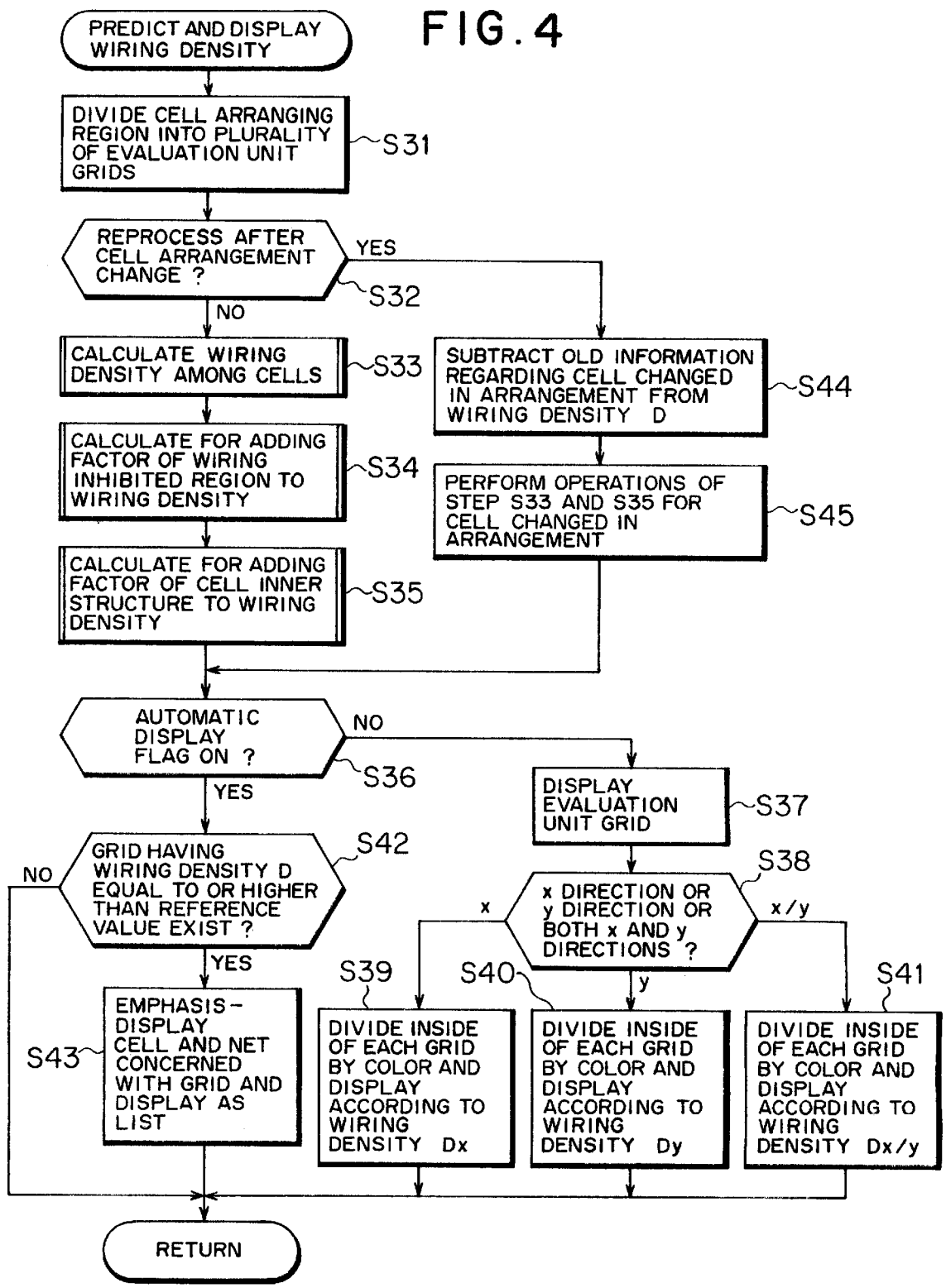
FIG. 4 is a flowchart illustrating a procedure for predicting and displaying a wiring density by the cell arranging device of the embodiment.
Figure 5:
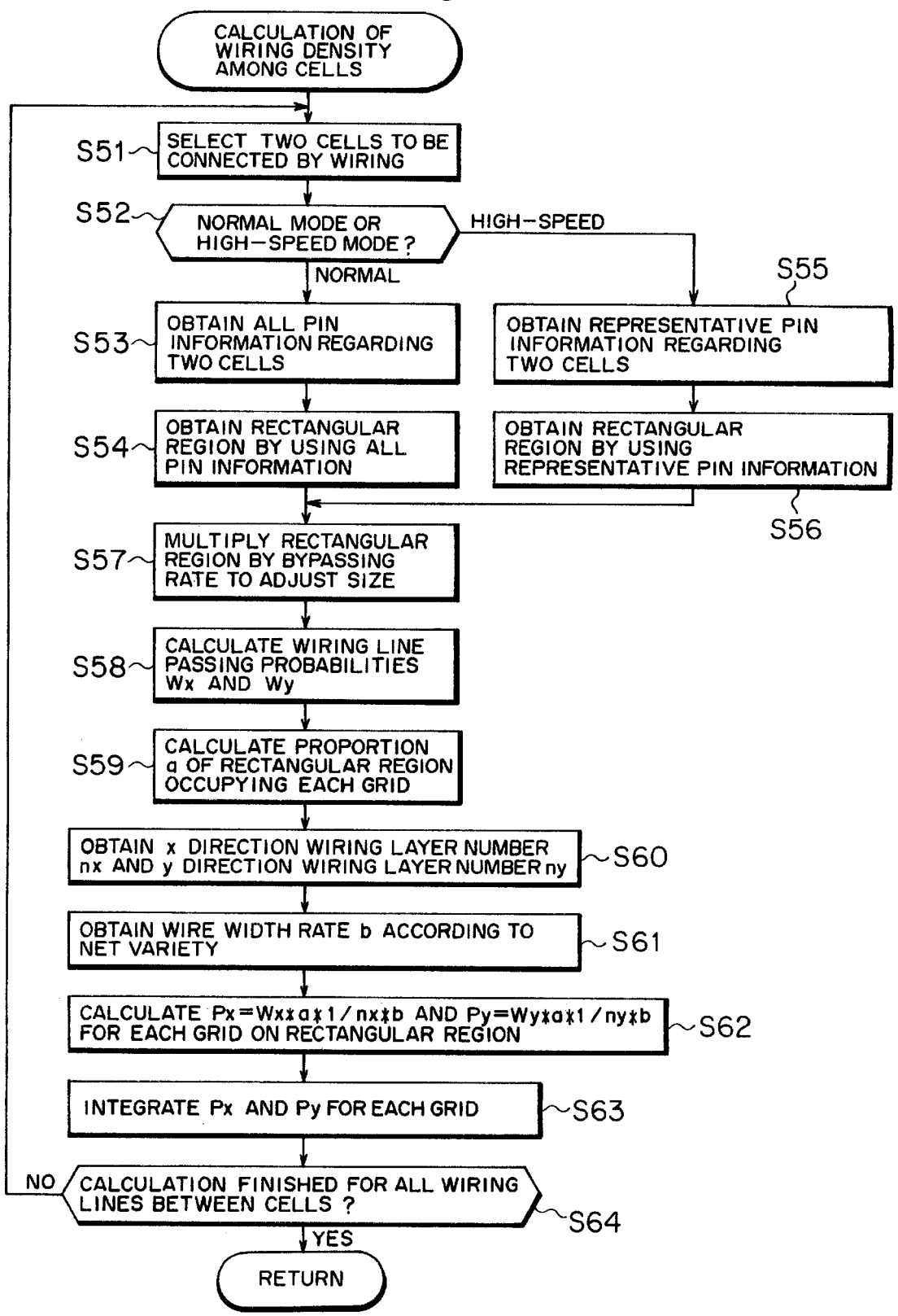
FIG. 5 is a flowchart illustrating a procedure for calculating a wiring density among cells in the embodiment.
Figure 6:
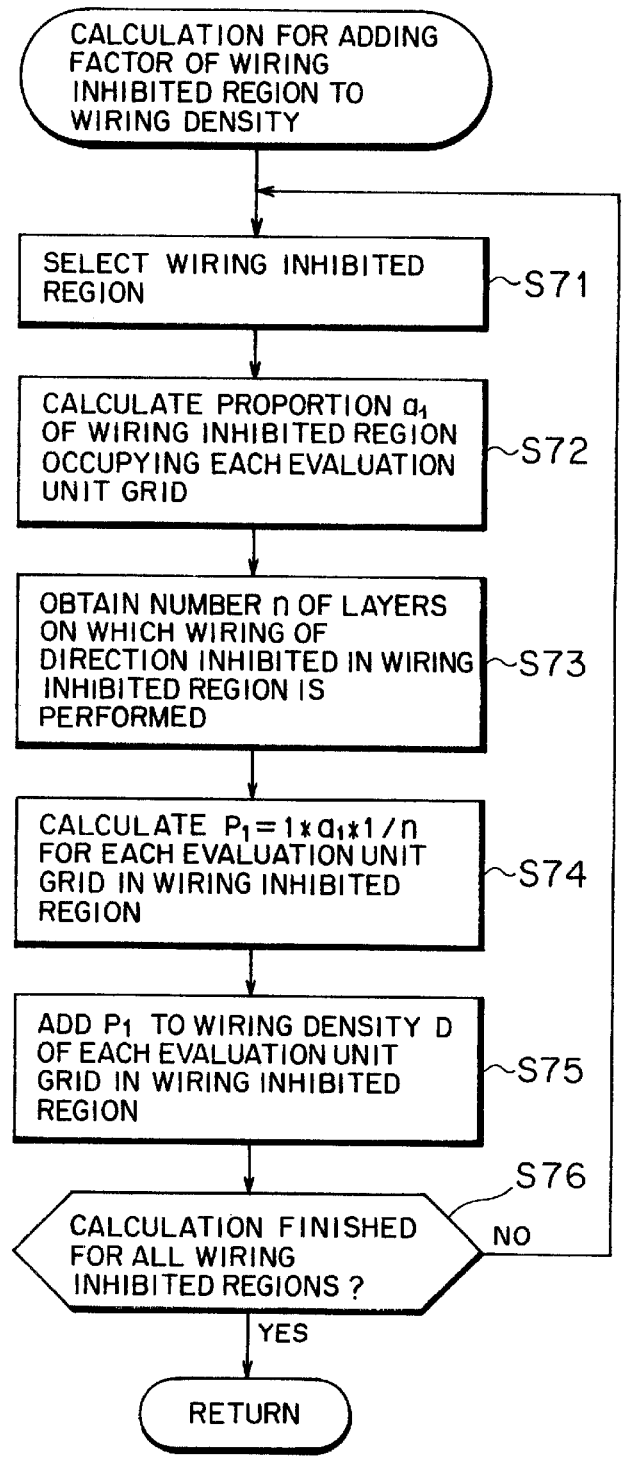
FIG. 6 is a flowchart illustrating an operation procedure for adding a factor of a wiring inhibited region to a wiring density in the embodiment.
Figure 7:
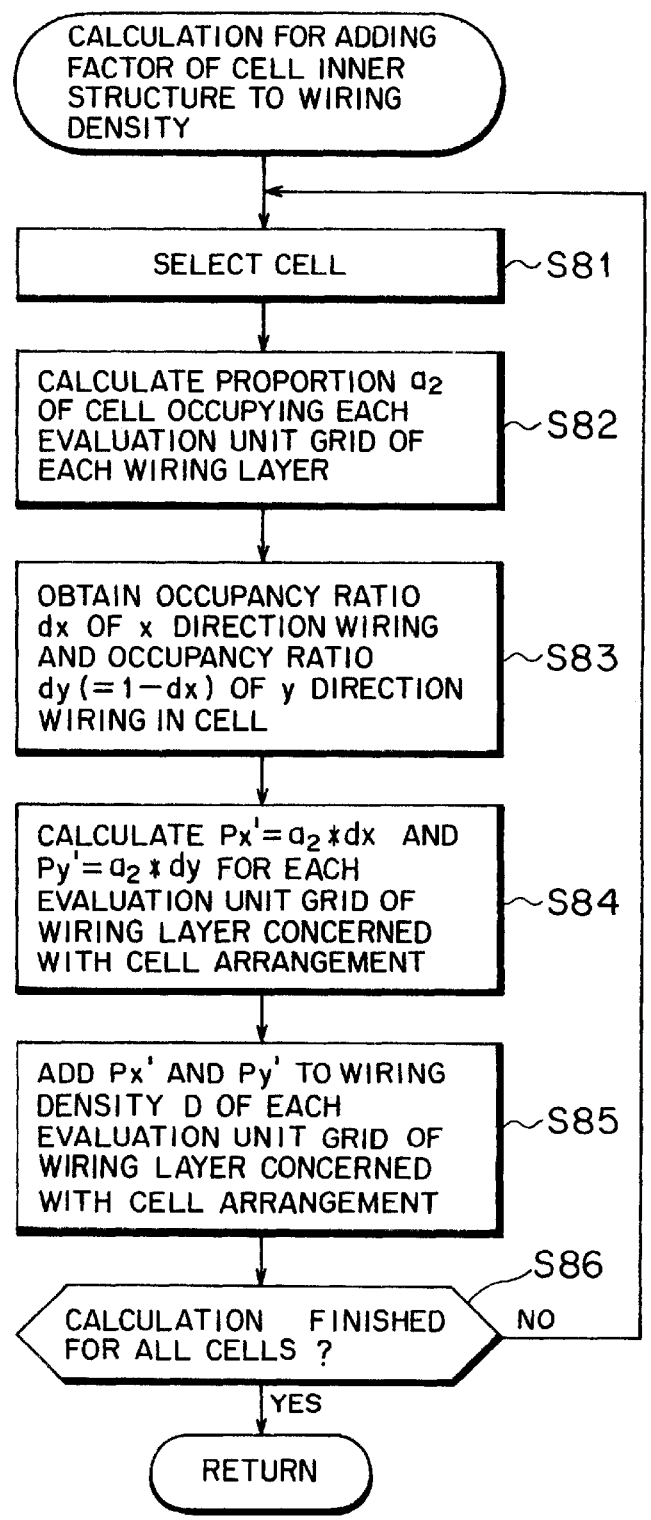
FIG. 7 is a flowchart illustrating an operation procedure for adding a factor of cell inner structure to a wiring density in the embodiment.

FIG. 4 is a flowchart (step S31 to S45) illustrating a procedure (entire flow) for performing wiring density prediction and displaying. FIG. 5 is a flowchart (step S51 to S64) illustrating more in detail an arithmetic operation procedure for calculating a wiring density among cells (step S33 of FIG. 4). FIG. 6 is a flowchart (step S71 to S76) illustrating more in detail an arithmetic operation procedure for adding the factor of a wiring inhibition area to a wiring density (step S34 of FIG. 4). FIG. 7 is a flowchart (step S81 to S86) illustrating more in detail an arithmetic operation procedure for adding the factor of a cell inner structure to a wiring density (step S35 of FIG. 4).

As shown in FIG. 4, first, the dividing section 60 divides, based on a size registered in the control parameter storing section 34, a specified cell arranging region into a plurality of evaluation unit grids (step S31). FIG. 8 shows a specific example of evaluation unit grids. In FIG. 8, dotted lines denote wiring grids and solid lines denote evaluation unit grids. One wiring grid corresponds to a minimum wire width (wire width of a normal wiring line). In the example of FIG. 8, a square region having ten grids respectively in x and y directions forms one evaluation unit grid.

Then, determination is made as to whether current wiring density prediction is processing after wiring density prediction performed at least once or not, in other words, whether it is reprocessing after a cell arrangement change (rearrangement) or not (step S32). If the current prediction is determined not to be reprocessing (NO route), calculation of a wiring density among the cells (step S33), calculation for adding the factor of a wiring inhibition area to the wiring density (step S34) and calculation for adding the factor of a cell inner structure (step S35) are then performed. The process to be taken if the current prediction is determined to be reprocessing after a cell arrangement change (rearrangement) in step S32 (YES route) will be described later by referring to FIG. 12.

Next, the operations of steps S33 to S35 will be described in detail respectively by referring to FIGS. 5 to 7.

For calculation of a wiring density among the cells (step S33), as shown in FIG. 5, first, the selecting section 61 selects, by referring to the cell arrangement information storing section 33, two cells to be connected by a wiring line from a number of cells arranged in a specified cell arranging region (step S51). Then, the rectangular region setting section 62 obtains a rectangular region in which the pins of the selected two cells to be connected are diagonal vertexes.

At this time, the rectangular region setting section 62 determines, by referring to the control parameter storing section 34, which has been selected/set, a normal mode or a high-speed mode, by the mode specifying flag of the control parameter storing section 34 (step S52).

If selection of the normal mode is determined ("NORMAL" route from step S52), all bits of pin information regarding the pins to be connected are then read from the cell library 32 (step S53). Based on all the bits of pin information, a rectangular region X×Y is obtained (step S54). On the other hand, if selection of the high-speed mode is determined ("HIGH SPEED" route from step S52), only representative information regarding the pins to be connected is then read from the cell library 32 (step S55). Based on the representative pin information, a rectangular region X×Y is obtained (step S56).

Figure 8:
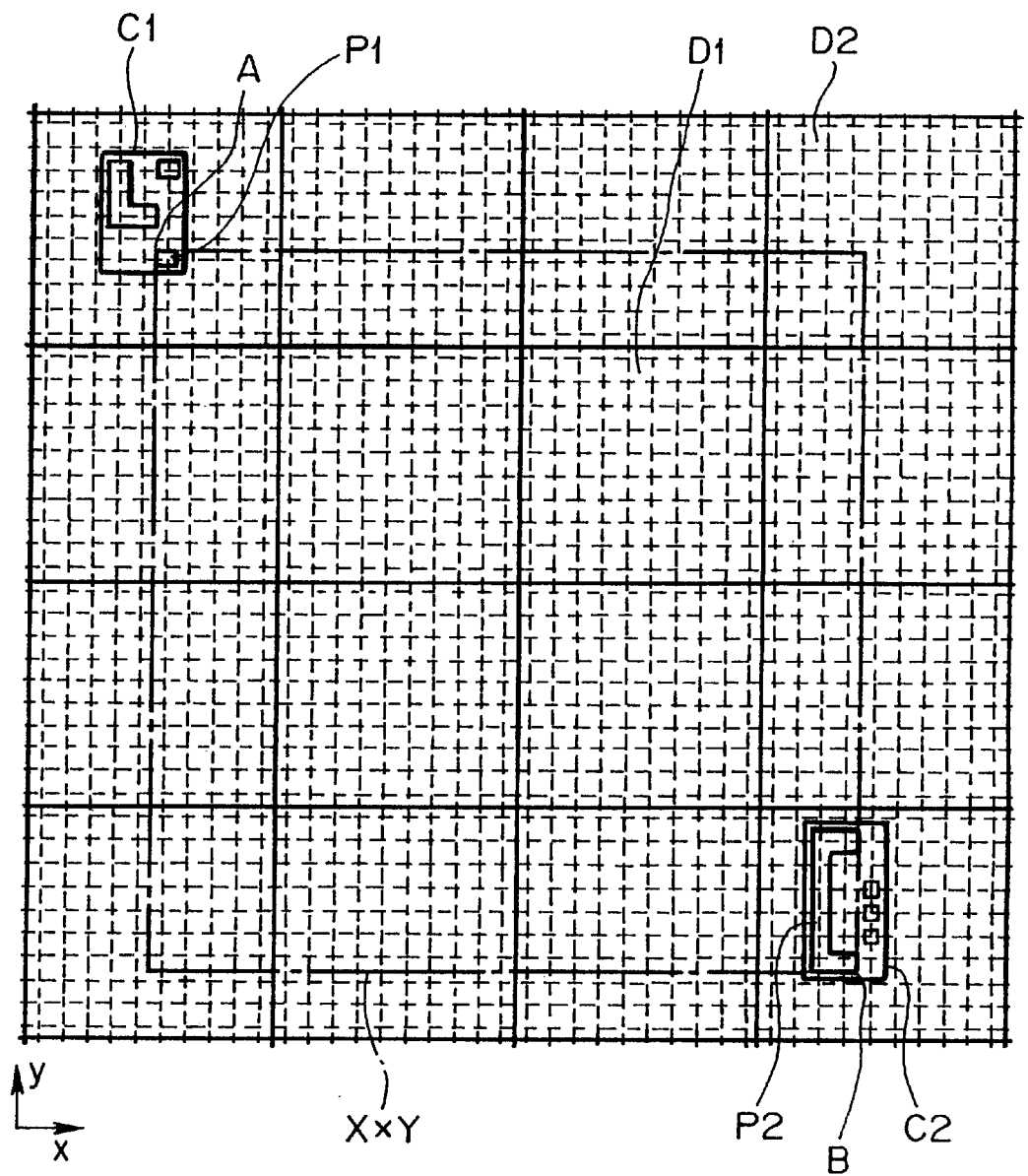
FIG. 8 is a view illustrating an evaluation unit grid and a rectangular region in the embodiment.

For example, as shown in FIG. 8, if the pin P1 of a cell C1 to be connected and the pin P2 of a cell C2 to be connected are connected by a wiring line, in the normal mode, farthest two points A and B between the pins P1 and P2 are selected. Then, a rectangular region X×Y in which these two points A and B are diagonal vertexes is obtained.

If the pin (cell inner wiring pattern) of each cell is formed to be complex in shape, its shape is expressed by using a plurality of rectangles, and these rectangles are registered each as pin information in the cell library 32. If plural bits of pin information are registered, one is registered as representative pin information therein. Then, for reading the bits of pin information from the cell library 32, the representative pin information is read first. Accordingly, a processing speed is considerably faster in the case of obtaining farthest two points A and B between representative pins by reading only the representative pin information than in the case of obtaining farthest two points by reading all the bits of pin information.

Figure 9:
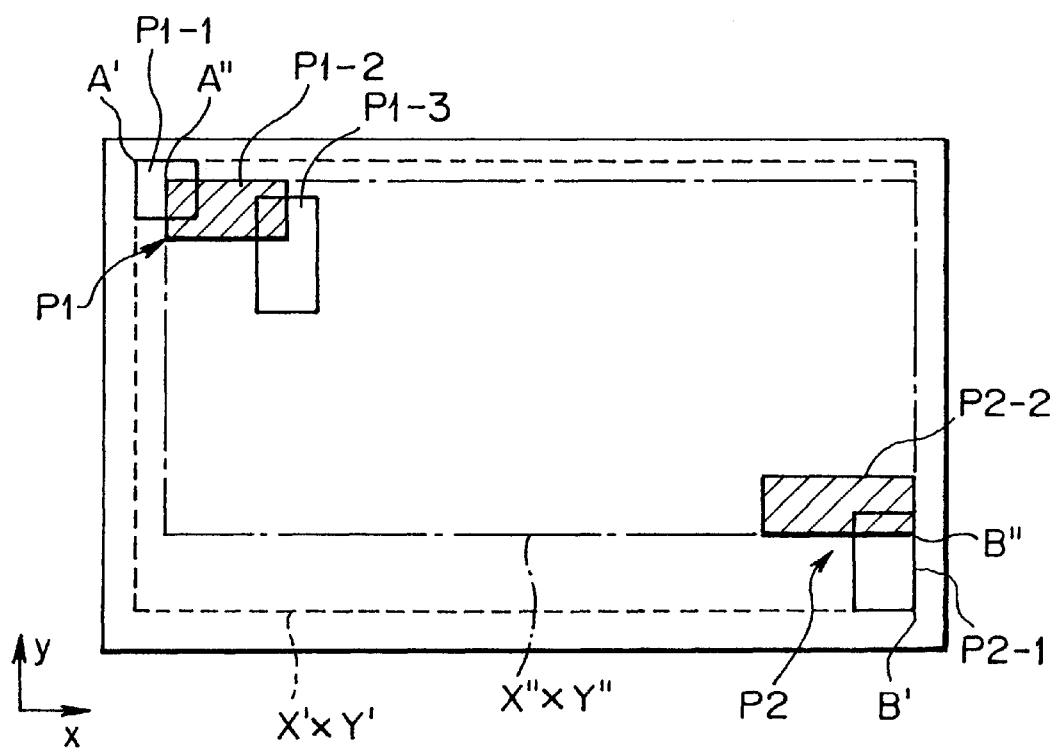
FIG. 9 is a view illustrating a process of obtaining rectangular regions in a normal mode and a high-speed mode in the embodiment.

For example, as shown in FIG. 9, it is now assumed that the pin P1 to be connected is expressed by using three rectangles P1-1, P1-2 and P1-3, the pin P2 to be connected is expressed by using two rectangles P2-1 and P2-2, and the rectangles P1-2 and P2-2 are registered respectively as representative pins.

In this case, in the normal mode, farthest points A' (left upper vertex of the rectangle P1-1) and B' (left lower vertex of the rectangle P2-1) between the entire pin P1 to be connected and the entire pin P2 to be connected are obtained. Then, a rectangular region X'×Y' in which the two points A' and B' are diagonal vertexes is obtained.

On the other hand, in the high-speed mode, farthest points A" (left upper vertex of the rectangle P1-2) and B" (left lower vertex of the rectangle P2-2) between the representative pin P1-2 of the pin P1 to be connected and the representative pin P2-2 of the pin P2 to be connected are obtained. Then, a rectangular region X"×Y" in which the two points A" and B" are diagonal vertexes is obtained.

If a rectangular region is set only by a representative pin, a small reduction may occur in the accuracy of the result of predicting a wiring density. However, the amount of data read from the cell library 32 may be reduced and thus time for obtaining a rectangular region can be greatly shortened.

The size of the rectangular region X×Y obtained in step S54 or S56 is further adjusted by the rectangular region setting section 62 based on the bypassing rates $m_x$ and $m_y$ of wiring routes registered in the control parameter storing section 34 (step S57).

For example, as shown in FIG. 10, if a rectangular region X×Y has been obtained for the two cells C1 and C2 and the bypassing rates of wiring routes in x and y directions have been set to $m_x$, and $m_y$, the lengths X and Y of the two sides of the rectangular region in the x and y directions are multiplied respectively by the bypassing rates $m_x$ and $m_y$. Thereby, the rectangular region X×Y can be adjusted to be (X* $m_x$)×(Y* $m_y$). At this time, the four vertexes of the new rectangular region (X*$m_x$)×(Y*$m_y$) obtained after the adjustment are disposed in positions equidistant from the four vertexes of the rectangular region X×Y before the adjustment. Accordingly, a rectangular region can be set large according to the bypassing rates of the x and y directions and a wiring density can be predicted by considering a region through which a wiring route may pass because of bypassing. If no bypassing occurs in the wiring route, since both of bypassing rates $m_x$ and $m_y$ are set to 1, the rectangular region X×Y is maintained even after processing in step S57.

After the rectangular region has been set in the foregoing manner, the wiring line passing probability calculating section 63 calculates probability of a wiring line passing through a certain grid point of the wiring grids in the rectangular region (step S58). In this case, it is assumed that probability of a wiring line between the pins of the two cells to be connected passing through each grid point of the wiring grids is uniform (constant) in the rectangular region. Then, based on this assumption, probabilities $W_x$ and $W_y$ of reaching the grid point respectively from the x and y directions are calculated as wiring line passing probabilities.

Next, a specific example of wiring line passing probability will be described by referring to FIG. 8. In the rectangular region X×Y, if wiring is performed by Manhattan wiring method, for any route, the length of a wiring route (wiring length) for connecting the two points A and B is always constant. Also, the number of grid points included in the wiring grids (the wiring route passes through the grid points) is always constant.

In the example shown in FIG. 8, on the wiring route for connecting the point A of the cell C1 and the point B of the cell C2, there are always twenty eight grid points included in the wiring grids, which the wiring line reaches from the x direction. There are always thirty grid points included in the wiring grids, which the wiring line reaches from the y direction. Accordingly, in the rectangular region X×Y, probability $W_x$ of the wiring line reaching one grid point of the wiring grids from the x direction is (28/(28+30))*(1/28*30). Similarly, probability $W_y$ of the wiring line reaching the grid point from the y direction is (30/(28+30))*(1/28*30).

After the wiring line passing probability has been calculated, the rectangular region occupancy ratio calculating section 64 calculates the proportion of the rectangular region occupying each evaluation unit grid [area ratio=(area of rectangular region overlapping evaluation unit grid/(area of evaluation unit grid)] as a rectangular region occupancy ratio a (step S59). Then, the numbers $n_x$ and $n_y$ of x direction wiring layers and y direction wiring layers are respectively read from the circuit design information storing section 31 (step S60). The weighting amount of a wire width (wire width rate) b made according to a net variety is read from the control parameter storing section 34 (step S61). The sequence of the operations performed in steps S59 to S61 is not limited to that shown in FIG. 5.

Then, the first influence value calculating section 65 calculates, for each evaluation unit grids, first wiring density influence values $P_x$ and $P_y$ to be used as indexes for the increase of a wiring density D in the evaluation unit grid made by the wiring between the currently selected two cells. This calculation is performed by using the foregoing expressions (1) and (2) respectively corresponding to the x and y wiring directions based on the probabilities $W_x$ and $W_y$, the rectangular region occupancy ratio a, the layer numbers $n_x$ and $n_y$ and the wire width rate b (step S62).

For example, in evaluation unit grids D1 shown in FIG. 8, since all the evaluation unit grids D1 overlap the rectangular region, a rectangular region occupancy ratio a is 1. On the other hand, in evaluation unit grids D2 shown in FIG. 8, since the evaluation unit grids D2 only partially overlap the rectangular region, a rectangular region occupancy ratio a is 16/100=(=0.16).

If the numbers of x direction wiring layers and y direction wiring layers are respectively $n_x$ and $n_y$, then, the probabilities $W_x$ and $W_y$ should be multiplied by the reciprocals of the layer numbers $n_x$ and $n_y$ respectively. For example, assuming that a circuit to be designed includes three layers, the first layer being a wiring layer of both x and y directions and the second and third layers both being wiring layers of y directions, $n_x$=1 and $n_y$=3 will be realized. In the evaluation unit grids D2 shown in FIG. 8, $P_x$=$W_x$*(16/100)*(1/1) and $P_y$=$W_y$* (16/100)*(1/3) will be realized.

In the embodiment, the probabilities $W_x$ and $W_y$ are also multiplied by the wire width rate b. For normal wiring, wiring is performed in the wiring grids. However, a special net such as a clock net or a power supply net has a wide wire width and adjacently placed wiring grids may also be used. Consequently, the probability of a wiring line passing through each evaluation unit grid may be increased. With this situation in mind, as described above, the wire width rate b is registered in the control parameter storing section 34 beforehand according to each net variety (wiring variety). Then, the first wiring density influence values $P_x$ and $P_y$ are multiplied by the wire width rate b and weighting is performed based on the wire width according to the net variety. Thereby, for a special net such as a clock net or a power supply net having a wire width larger than that of a normal wiring line, first wiring density influence values $P_x$ and $P_y$ can be calculated according to the size of the wire width.

For example, as shown in FIG. 11, a normal wiring line E1 uses only one wiring grid. On the other hand, a special wiring line E2 such as a clock wiring line or a power supply wiring line uses the grids of both sides, the total number of used grids amounting to three. In this case, by presetting 3(300%) as a wire width rate, first wiring density influence values $P_x$ and $P_y$ can be calculated according to the wire width. In FIG. 11, dotted lines denote wiring grids as in the case of FIG. 8.

Then, the wiring density calculating section 70 integrates the first wiring density influence values $P_x$ and $P_y$ calculated in the foregoing manner for each evaluation unit grid. Its integrated value (sum) is calculated as a wiring density in each evaluation unit grid (step S63).

Then, determination is made as to whether calculation has been performed for all the wiring lines among the cells arranged in the specified cell arranging region or not (step S64). If there are cells remaining to be connected by the wiring lines (NO route), the process then returns to step S51 to repeat the same processing. On the other hand, if calculation has been finished for all the wiring lines (YES route), this processing is finished and then the process moves to step S34 in FIG. 4.

In step S34, specifically, for performing calculation for adding the factor of a wiring inhibition area to the wiring density D, as shown in FIG. 6, first, by referring to the circuit design information storing section 31 and if any wiring inhibited regions exist in the cell arranging region, the wiring inhibited region occupancy ratio calculating section 66 selects a wiring inhibited region (step S71). Then, the wiring inhibited region occupancy ratio calculating section 66 calculates the proportion of the wiring inhibited region occupying each evaluation unit grid [area ratio=(area of wiring inhibited region overlapping evaluation unit grid)/(area of evaluation unit grid)] as a wiring inhibited region occupancy ratio $a_1$ (step S72).

Then, the second influence value calculating section 67 reads, from the circuit design information storing section 31, the number n of wiring layers for performing wiring of inhibited directions (x and y) in the wiring inhibited region (step S73). Then, the second influence value calculating section 67 calculates, for each evaluation unit grid, by assuming that the probability of wiring existence in the wiring inhibition area is 1, a second wiring density influence value $P_1$ to be used as an index for the increase of the wiring density D made by the factor of the wiring inhibited region in the evaluation unit grid. This calculation is performed by using the foregoing expression (3) based on the wiring inhibited region occupancy ratio $a_1$ and the layer number n (step S74).

For example, if a certain evaluation unit grid is a wiring inhibited region for all the wiring layers, a second wiring density influence value $P_1$ would be 1. If in one layer selected from x direction wiring layers amounting to n in number, $\frac{1}{2}$ ($=a_1$) of a certain evaluation unit grid is a wiring inhibited region, a second wiring density influence value $P_1$ will be $1*(\frac{1}{2})*(1/n)$.

Then, the wiring density calculating section 70 integrates, for each evaluation unit grid, the second wiring density influence values $P_1$ calculated for each evaluation unit grid in the foregoing manner. The wiring density calculating section 70 then adds the result of its integration to the already calculated sum of the first wiring density influence values $P_x$ and $P_y$ so as to obtain a wiring density D in each evaluation unit grid (step S75).

Then, determination is made as to whether calculation has been finished for all the wiring inhibition areas in the specified cell arranging region or not (step S76). If there are wiring inhibited regions remaining to be processed (NO route), the process then returns to step S71 to repeat the same processing. On the other hand, if calculation has been finished for all the wiring inhibited regions (YES route), the processing is finished and then the process moves to step S35 of FIG. 4.

In step S35, specifically, for performing calculation for adding the factor of a cell inner structure to the wiring density D, as shown in FIG. 7, first, the cell occupancy ratio calculating section 68 selects a cell to be arranged in the cell arranging region by referring to the cell arrangement information storing section 33 (step S81). Then, the cell occupancy ratio calculating section 68 calculates the proportion of the cell occupying each evaluation unit grid of each wiring layer [area ratio=(area of cell overlapping evaluation unit grid)/(area of evaluation unit grid)] as a cell occupancy ratio $a_2$. The cell area is read from the cell library 32.

Then, the third influence value calculating section 69 reads x direction and y direction wiring occupancy ratios $d_x$ and $d_y$ ($=1-d_x$) in the selected cell from the control parameter storing section 34 (step S83). The third influence value calculating section 69 then calculates, for each evaluation unit grid, third wiring density influence values $P_x'$ and $P_y'$ to be used as indexes for the increase of the wiring density D made by the factor of the cell inner structure (wiring patterns and pins) in the evaluation unit grid. This calculation is performed by using the foregoing expressions (4) and (5) respectively corresponding to the x and y wiring directions based on the cell occupancy ratio $a_2$ and the wiring direction occupancy ratios $d_x$ and $d_y$ (step S84).

In the embodiment, rather than making uniform wiring layers used by the wiring patterns (pins) as cell inner structure constituting elements, used wiring layers are distributed according to the x and y wiring direction occupancy ratios $d_x$ and $d_y$, and the degrees of influence given by the factors of the wiring patterns in each cell to the wiring density D in each evaluation unit grid are calculated as third wiring density influence values $P_x'$ and $P_y'$ respectively for the x and y wiring directions.

For example, if a cell inner structure is realized only by a surface layer and the main wiring direction of the surface layer of a circuit (chip) to be designed is an x direction, an x wiring direction occupancy ratio $d_x$ is registered as 1(100%; $d_y=0$) in the control parameter storing section 34. By performing calculation with the foregoing expressions (4) and (5) based on the value thereof, only a third wiring density influence value $P_x'$ in the evaluation unit grid of the x direction wiring layer can be calculated.

The wiring density calculating section 70 integrates, for each evaluation unit grid, the third wiring density influence values $P_x'$ and $P_y'$ calculated for each evaluation unit grid in the foregoing manner. The wiring density calculating section 70 then adds the result of its integration to the already calculated sum of the first wiring density influence values $P_x$ and $P_y$ and the second wiring density influence value $P_1$ so as to obtain a wiring density D in each evaluation unit grid (step S85).

Then, determination is made as to whether calculation has been finished for all the cells or not (step S86). If not finished (NO route), the process then returns to step S81 to repeat the same processing. On the other hand, if calculation has been finished for all the cells (YES route), this processing is finished and the process then moves to step S36 of FIG. 4.

By the foregoing processing, the wiring density calculating section 70 calculates, for each evaluation unit grid, a sum of the first wiring density influence values $P_x$ and $P_y$ calculated for wiring among the cells, the second wiring density influence value $P_1$ calculated for the wiring inhibited region and the third wiring density influence values $P_x'$ and $P_y'$., Then, the wiring density calculating section 70 sets the obtained sum as a wiring density in each evaluation unit grid.

In this case, as described above, for calculating an x direction wiring density $D_x$, the influence values $P_x$, $P_1$ and $P_x'$ calculated for the x direction are integrated for each evaluation unit grid. For calculating a y direction wiring density $D_y$, the influence values $P_y$, $P_1$ and $P_y'$ calculated for the y direction are integrated for each evaluation unit grid. For calculating a wiring density $D_{x/y}$ of both x and y directions, all the influence values $P_x$, $P_y$, $P_1$, $P_x'$ and $P_y'$ are integrated for each evaluation unit grid.

After calculation (prediction) of the wiring density D has been finished in the foregoing manner, as shown in FIG. 4, the display control unit 11 determines whether the automatic flag of the control parameter storing section 34 has been set ON or not (step S36). If not ON (NO route), the display control unit 11 controls the display 10 to display the evaluation unit grid in the specified cell arranging region (step S37) and then determines which should be displayed, the x direction wiring density, the y direction wiring density or the wiring density of both x and y directions (step S38).

For displaying the x direction wiring density ("x" route), a display condition in each evaluation unit grid is divided by color according to the x direction wiring density $D_x$ and then displayed (step S39). For displaying the y direction wiring density ("y" route), a display condition in each evaluation unit grid is divided by color according to the y direction wiring density $D_y$ and then displayed (step S40). For displaying the wiring density $D_{x/y}$ of both x and y directions ("x/y" route), a display condition in each evaluation unit grid is divided by color according to the wiring density $D_{x/y}$ of both x and y directions and then displayed (step S41).

FIG. 13 shows an example (example of displaying wiring density stepwise) of a wiring density screen displayed on the display 10 in each of steps S37 to S41. Each of the grids shown in FIG. 13 is equivalent to the foregoing evaluation unit grid. The inside of the evaluation unit grid is divided by color, for example red, orange, yellow, green, blue and dark blue in the decreasing order of wiring densities, and displayed. However, the displaying method is not limited to such coloring. Any displaying method can be used as long as it enables the degree of a wiring density to be determined according to a displaying condition in each evaluation unit grid. For example, as actually shown in FIG. 13, wiring densities may be displayed stepwise according to patterns described in each evaluation unit grid.

With the cell arranging device 1 of the embodiment, since a plurality of wiring density screens like that shown in FIG. 13 can be displayed on the display 10, wiring density screens for a plurality of different cell arranging states can be simultaneously displayed on the display 10 and then wiring densities can be compared and evaluated.

On the other hand, if it is determined in step S36 that the automatic flag of the control parameter storing section 34 has been set ON (YES route), the display control unit 11 then compares the wiring density in each evaluation unit grid obtained by the wiring density predicting unit 42 with a reference value preset in the control parameter storing section 34. Then, the display control unit 11 determines the existence of an evaluation unit grid having a wiring density D higher than the reference value (step S42).

If the existence of an evaluation unit grid having a wiring density D higher than the reference value (YES route) is determined, the display control unit 11 then controls the display 10 to automatically display cells existing in the evaluation unit grid having the wiring density D higher than the reference value, a net (wiring lines) passing through the evaluation unit grid and cells connected to the net on its cell arrangement screen with emphasis as shown in FIG. 14. Then, information (cell name or net name) regarding the cells or the net displayed with emphasis is displayed in another window on the display 10 as a list like that shown in FIG. 15 (step S43).

Figure 3:
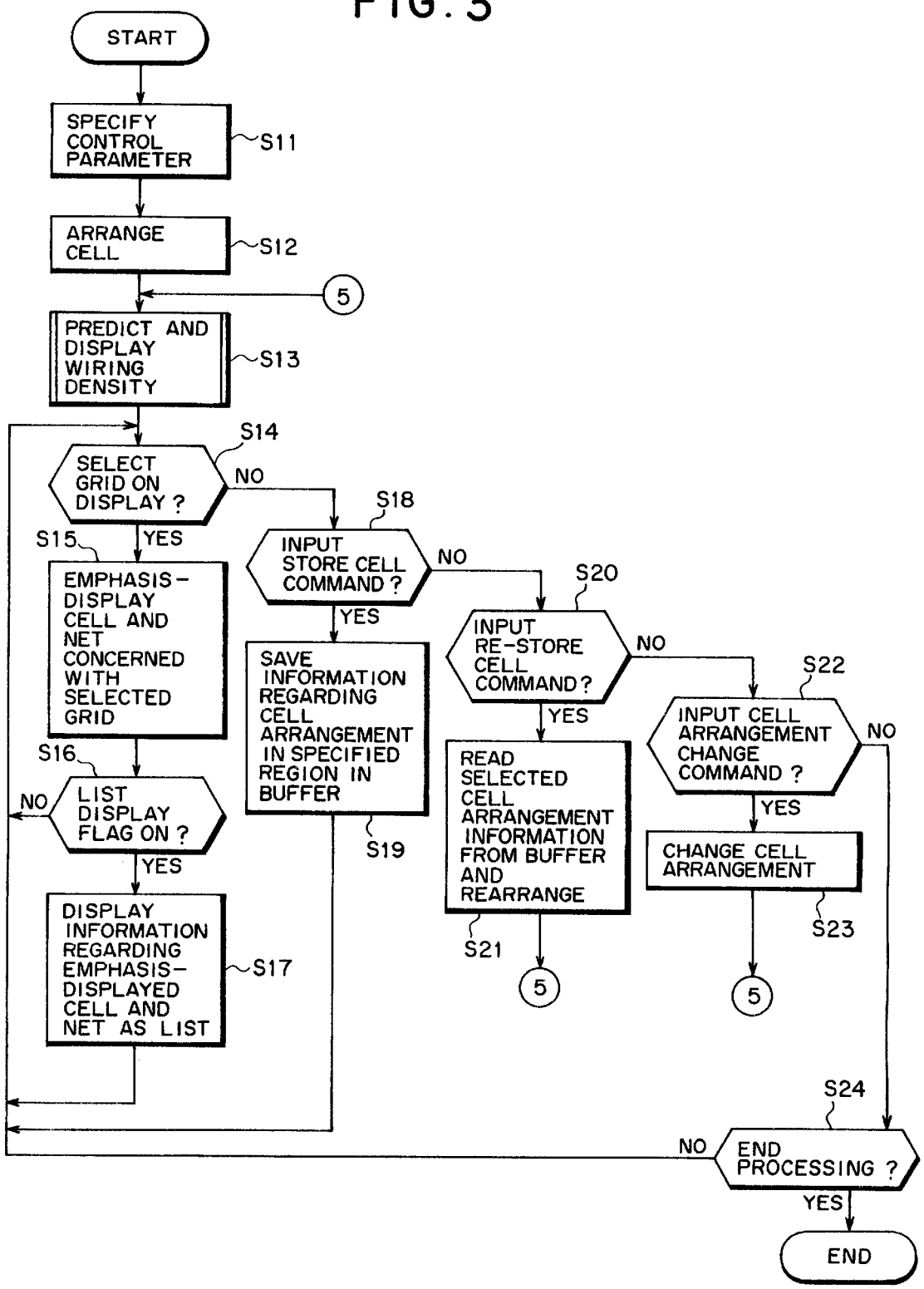
FIG. 3 is a flowchart illustrating a procedure for performing cell arrangement by the cell arranging device of the embodiment.

FIG. 14 shows examples of the cells and the net displayed with emphasis on the cell arrangement screen on the display 10 by the foregoing operations in steps S15 and S43 of FIGS. 3 and 4. In FIG. 14, a cell existing in a specified evaluation unit grid or one having a wiring density D higher than the reference value is displayed with emphasis by, for example red (hatched region), a net passing through the evaluation unit grid is displayed with emphasis by, for example yellow (chain line) and a cell connected to the net is displayed with emphasis by, for example blue (half-tone dot meshed region). However, the emphasis-displaying method is not limited to such coloring. Any emphasis-displaying methods may be used, for example emphasis-displaying based on highlighting.

FIG. 15 shows an example of the list displayed on the display 10 by the foregoing operations in steps S17 and S43 of FIGS. 3 and 4. In the list shown in FIG. 15, the upper side displays information regarding a cell existing in a specified evaluation unit grid or one having a wiring density D higher than the reference value. The lower side displays information regarding a net passing through the evaluation unit grid.

After the displaying operations performed in steps S39 to S41 and A43 have been finished, or if it is determined in step S42 that no evaluation unit grid having a wiring density D higher than the reference value exists (NO route), the process moves to step S14 of FIG. 3.

If, in step S32 of FIG. 4, reprocessing after a cell arrangement change (rearrangement) is determined (YES route), in other words, if the wiring density predicting unit 42 predicts a wiring density in each evaluation unit grid, cell arrangement is then changed based on the result of predicting the wiring density D, and the wiring density predicting unit 42 predicts a wiring density D again based on the changed cell arrangement, according to the embodiment, the following processing is performed.

The wiring density predicting unit 42 subtracts, for the cell changed in arrangement, first and third wiring density influence values $P_x$, $P_y$, $P_x'$ and $P_y'$ calculated before the arrangement change from the wiring density D of an evaluation unit grid concerned with the cell (step S44).

Then, the operations of steps S33 and S35 are performed for the cell after the arrangement change. For the cell, first and third wiring density influence values $P_x$, $P_y$, $P_x'$ and $P_y'$ are then calculated for each evaluation unit grid. Then, the wiring density calculating section 70 adds, for each evaluation unit grid, the recalculated first and third wiring density influence values $P_x$, $P_y P_x'$ and $P_y'$ to the result of the foregoing subtraction and sets the result of its addition as a wiring density D in the evaluation unit grid (step S45). Then, the process moved to step S36.

Figure 12:
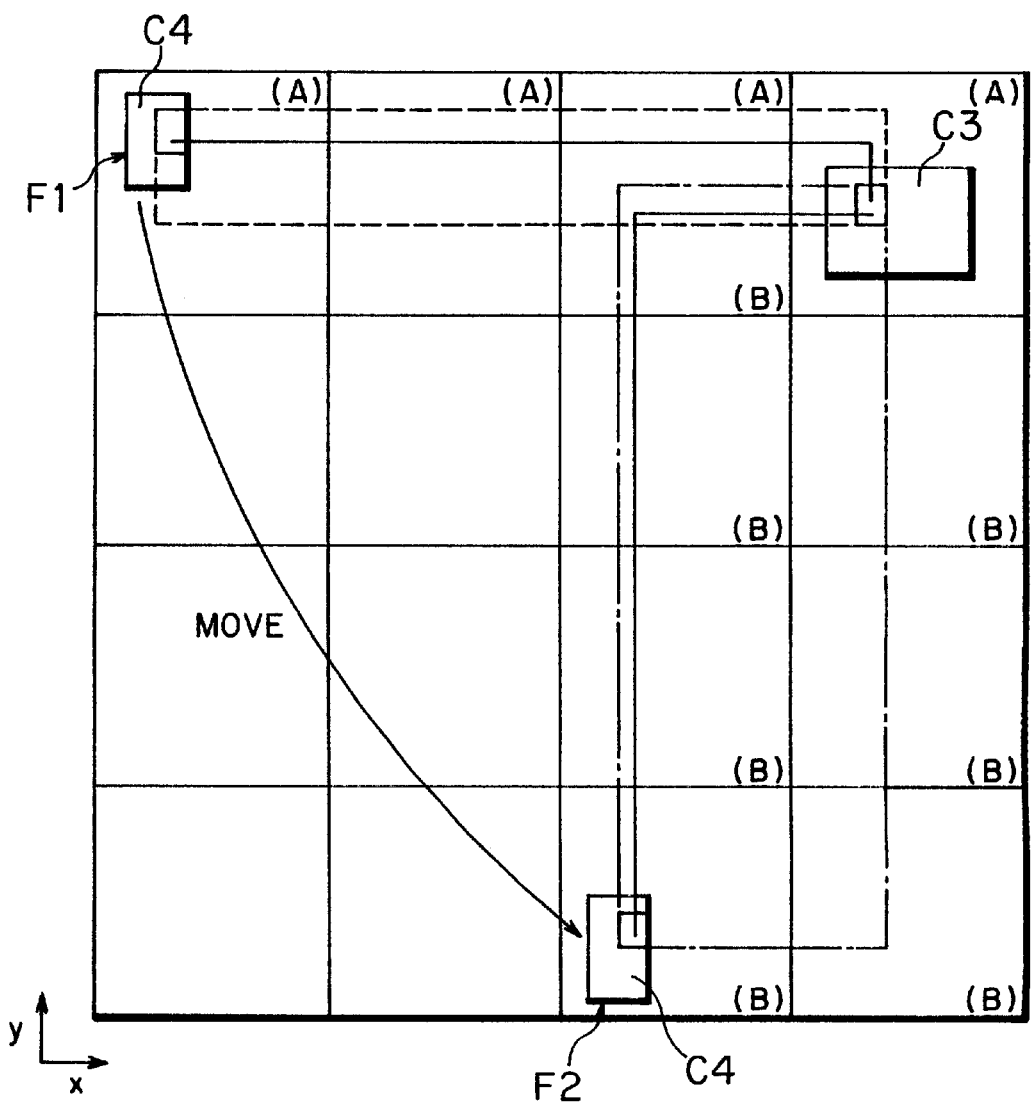
FIG. 12 is a view showing a specific example of a procedure for re-predicting a wiring density after a cell arrangement change in the embodiment.

FIG. 12 shows a specific example of the step of re-predicting a wiring density after a cell arrangement change. Each of the grids shown in FIG. 12 is equivalent to an evaluation unit grid.

As shown in FIG. 12, assuming that the cell C3 and the cell C4 arranged in a position F1 are to be connected by a wiring line, if the cell C4 is moved from the position F1 to a position F2 while a wiring density D has been calculated for each evaluation unit grid, a rectangular region (wiring route region) between the cells C3 and C4 will be changed from one indicated by a dotted line to one indicated by a chain line. In this case, old information (first and third wiring density influence values $P_x$, $P_y$, $P_x'$ and $P_y'$) is subtracted from the wiring density D calculated for the evaluation unit grid denoted by a code (A). Then, by adding information (first and third wiring density influence values $P_x$, $P_y$, $P_x'$ and $P_y'$) newly calculated for the evaluation unit grid denoted by a code (B), a wiring density after a cell arrangement change can be predicted again by a minimum calculating amount without recalculating a wiring density D for all the cells.

As apparent from the foregoing, the effects of the first embodiment of the present invention can be summarized as follows.

A value is obtained by integrating probabilities (first wiring density influence values $P_x$ and $P_y$) of wiring lines for connecting the cells passing through each evaluating unit grid. This value is specifically calculated as a predicting value for a wiring density in each evaluation unit grid. Accordingly, a wiring density among a number of cells can be predicted within a very short time.

Since, during cell arranging, a wiring density D can be predicted only based on the result of arranging cells without starting any wiring programs unlike the conventional case, wiring condition evaluation based on the wiring density D can be easily performed within a short time.

Accordingly, since cell arrangement having a high wiring condition can be performed within a short time before actual wiring and a possibility of the necessity of cell rearrangement after the actual wiring can be greatly reduced, circuit designing can be performed very efficiently.

The degrees of influence given by the factors of a wiring inhibited region and a cell inner structure to a wiring density in each evaluation unit grid are calculated as second and third wiring density influence values $P_1$, $P_x'$ and $P_y'$ and then added to a predicting value for a wiring density. Accordingly, a wiring density D including the factors of the wiring inhibited region and the cell inner structure can be estimated and a wiring condition among the cells can be surely and accurately evaluated.

Setting is switched between the normal mode and the high-speed mode. Specifically, in the normal mode, the positions of the pins to be connected are obtained by using all bits of pin information registered in the cell library 32. Accordingly, a wiring density D can be accurately predicted. In the high-speed mode, the positions of the pins to be connected are obtained by using only representative pin information. Accordingly, the amount of data to be read from the cell library 32 can be reduced, time needed for obtaining a rectangular region can be shortened and thus prediction of a wiring density D, in other words, wiring condition evaluation, can be performed at a higher speed.

For obtaining a rectangular region through which a wiring line connecting the two cells may pass, by greatly adjusting the rectangular region according to the bypassing rate of a wiring route, a wiring density D including the factor of a region possibly passed by the wiring route during bypassing can be estimated. Accordingly, a wiring condition among the cells can be evaluated more surely and accurately.

By performing weighting (multiplying of wire width rate b) for first wiring density influence values $P_x$ and $P_y$ based on a wire width according to a net variety, for a special net such as a clock net or a power supply net having a wire width large than that of a normal wiring line, first wiring density influence values $P_x$ and $P_y$ matching the size of the wire width can be calculated. Accordingly, a wiring density D including the factor of a wiring net can be estimated and thus a wiring condition among the cells can be evaluated more surely and accurately.

According to the embodiment, as described above with reference to FIG. 12, since a wiring density D after the change of cell arrangement can be predicted again by a minimum calculation amount without recalculating a wiring density D for all the cells, even if cell rearranging is performed for realizing cell arrangement having a high wiring condition before actual wiring, a wiring density after the rearrangement can be quickly predicted. Accordingly, the cells can be arranged to have a high wiring condition within a short time before actual wiring and thus circuit designing efficiency can be greatly increased.

By dividing a display state in each evaluation unit grid on the display 10 by color according to a wiring density D calculated for each evaluation unit grid as shown in FIG. 13, the operator can determine, only at a glance, the place of a high wiring density in the cell arranging region, in other words, a target region for cell rearrangement. Accordingly, a wiring condition can be evaluated very easily.

As shown in FIG. 14, by displaying cells and a net concerned with an evaluation unit grid selected on the display 10 on the cell arrangement screen thereon with emphasis, the operator can use the display for determining cell rearrangement. In other words, the operator can visually capture and determine cells existing in a portion (evaluation unit grid having a high wiring density D) of wiring congestion, that is, cells to be rearranged.

In this case, in addition to such emphasis-displaying, by displaying information regarding the cells and the wiring lines displayed with emphasis on the display 10 as a list like that shown in FIG. 15, the operator can immediately recognize specific information for specifying the cells and the wiring line included in the wiring congestion.

Accordingly, the operator can quickly determine the arranged cells greatly concerned with the wiring congestion and move the arranged cells (cell rearrangement) very smoothly for softening the wiring congestion.

If the automatic display flag is ON, cells and a net concerned with an evaluation unit grid having a wiring density equal to or higher than a reference value are automatically displayed with emphasis on the cell arrangement screen on the display 10. Then, bits of information regarding the cells and the wiring line displayed with emphasis are automatically displayed as a list on the display 10. Thereby, the operator can capture and quickly determine the cells and the wiring line concerned with the evaluation unit grid having a high degree of wiring congestion (wiring density) on the display 10 and immediately recognize specific information for specifying the cells and the wiring line. Accordingly, the operator can quickly determine the arranged cells greatly concerned with the wiring congestion and move the arranged cells (cell rearrangement) very smoothly for softening the wiring congestion.

Furthermore, the operator can input/set various control parameters ① to ⑦ from the input unit 20 in an interactive manner. Accordingly, the operator can properly set a condition for calculating (predicting) a wiring density D, a wiring condition evaluation reference and a processing speed (normal/high-speed) and execute cell arranging while performing optimal wiring condition evaluation according to situations.

Therefore, it can be understood that the cell arranging device 1 of the embodiment enables re-prediction of a wiring density D to be performed at a high speed as described above and also optimal cell arranging to be performed easily and at a high speed by using the cell arrangement information store/re-store functions described above with reference to FIG. 3.

The embodiment of the present invention has been described. It should be understood, however, that the invention is not limited to the foregoing embodiment and various changes and modifications can be made in accordance with the teachings of the invention.

What is claimed is:

1. A method for evaluating an arrangement of a multiplicity of cells, whose interconnection relationship is previously determined, in a predetermined region, which has been divided into a first grid by units of a minimum pitch of wiring, using a predicted wiring density among the arranged multiple cells in designing a circuit so that a multiplicity of wiring lines are routed along the first grid of the predetermined region to interconnect between the multiple cells in accordance with the interconnection relationship in a subsequent stage of the circuit designing, said method comprising the steps of:

(i) dividing the predetermined region into a second grid of unit squares, each of the unit squares being a unit of prediction of the wiring density;

(ii) selecting, for each of the multiple wiring lines, two cells having a pair of pins to be interconnected by each said wiring line from the arranged multiple cells;

(iii) setting a rectangular region whose one diagonal pair of vertexes is the pair of pins of the two cells selected for each said wiring line;

(iv) calculating, for each of intersections of the first grid which are situated within the rectangular region, a probability that each said wiring line is routed to pass through each said intersection within the rectangular region as a wiring-line passing probability, assuming that the wiring line passing probability is uniform at every intersection within the rectangular region;

(v) calculating, for each of the unit squares of the second grid, a proportion of an area occupied by the rectangular region to an entire area of each said unit square as a rectangular region occupancy ratio;

(vi) multiplying, for each said unit square, the wiring line passing probability for any intersection within the rectangular region by the rectangular-region occupancy ratio for each said unit square to thereby obtain a first wiring density influence value for each said unit square, said first wiring density influence value representing an increment of the wiring density caused by each said wiring line;

(vii) totaling, for each said unit square, the first wiring-density influence values for all of the multiple wiring lines to thereby predict the wiring density of each said unit square; and (viii) evaluating the arrangement of the multiple cells based on the predicted wiring density in each said unit square.

2. A cell arrangement evaluating method as claimed in claim 1, further comprising the steps of:

when there is any wiring prohibited region in the predetermined region, calculating, for each said unit square, a proportion of an area occupied by the wiring prohibited region to an entire area of each said unit square as a wiring prohibited region occupancy ratio;

multiplying, for each said unit square, the wiring line passing probability within the wiring prohibited region, which probability is assumed to be 1, by the wiring prohibited-region occupancy ratio for each said unit square to thereby obtain a second wiring density influence value for each said unit square, said second wiring density influence value representing an increment of the wiring density caused by the wiring prohibited region; and adding the second wiring density influence value for each said unit square to the wiring density in each said unit square to thereby modify the wiring density in each said unit square.

3. A cell arrangement evaluating method as claimed in claim 1, further comprising the steps of:

calculating, for each said unit square, a proportion of an area occupied by a selected one of the multiple cells to an entire area of each said unit square as a cell occupancy ratio;

multiplying, for each said unit square, the wiring-line passing probability within the selected cell, which probability is previously determined for the selected cell, by the cell occupancy ratio for each said unit square to thereby obtain a third wiring density influence value for each said unit square, said third wiring-density influence value representing an increment of the wiring density caused by the selected cell; and adding the third wiring density influence value for each said unit square to the wiring density in each said unit square to thereby modify the wiring density in each said unit square.

4. A cell arrangement evaluating method as claimed in claim 1, wherein said step (iii) includes locating the pair of pins of the two cells in order to set the rectangular region, using representative information regarding said pins, which information has been registered in a cell library.

5. A cell arrangement evaluating method as claimed in claim 1, wherein said step (iii) includes locating the pair of pins of the two cells in order to set the rectangular region, selectively using (a) all bits of information regarding said pins in a normal made which information has been registered in a cell library, and (b) representative bits selected from the information regarding said pins in a high-speed mode.

6. A cell arrangement evaluating method as claimed in claim 1, wherein in said step (iii), a size of the rectangular region is adjusted based on a bypassing rate of a wiring route.

7. A cell arrangement evaluating method as claimed in claim 1, wherein said step (vi) includes adjusting said first wiring density influence value based on a width of each said wiring line according to a variety of each said wiring line.

8. A cell arrangement evaluating method as claimed in claim 3, further comprising the steps of:

when one or more cells in the multiple cells are rearranged after the evaluation of the arrangement of the multiple cells in said step (viii), subtracting, for each of the unit squares associated with the rearranged cells, the first and third wiring density influence values calculated for the rearranged cells before the rearrangement from the wiring density in each of the associated unit squares before the rearrangement;

calculating, for each said associated unit square, first and third wiring density influence values for the rearranged cells after the rearrangement; and adding, for each said associated unit square, said recalculated first and third wiring density influence values of rearrangement to a result of said subtraction to thereby obtain a wiring density in each said associated unit square after the rearrangement.

9. A computer-readable storage medium storing a program for evaluating an arrangement of a multiplicity of cells, whose interconnection relationship is previously determined, in a predetermined region, which has been divided into a first grid by units of a minimum pitch of wiring, using a predicted wiring density among the arranged multiple cells in designing a circuit so that a multiplicity of wiring lines are routed along the first grid of the predetermined region to interconnect between the multiple cells in accordance with the interconnection relationship in a subsequent stage of the circuit designing, wherein said cell arrangement evaluating program instructs a computer to carry out the following functions of:

(i) dividing the predetermined region into a second grid of unit squares, each of the unit squares being a unit of prediction of the wiring density;

(ii) selecting, for each of the multiple wiring lines, two cells having a pair of pins to be interconnected by each said wiring line from the arranged multiple cells;

(iii) setting a rectangular region whose one diagonal pair of vertexes is the pair of pins of the two cells selected for each said wiring line;

(iv) calculating, for each of intersections of the first grid which are situated within the rectangular region, a probability that each said wiring line is routed to pass through each said intersection within the rectangular region as a wiring line passing probability, assuming that the wiring line passing probability is uniform at every intersection within the rectangular region;

(v) calculating, for each of the unit squares of the second grid, a proportion of an area occupied by the rectangular region to an entire area of each said unit square as a rectangular region occupancy ratio;

(vi) multiplying, for each said unit square, the wiring line passing probability for any intersection within the rectangular region by the rectangular region occupancy ratio for each said unit square to thereby obtain a first wiring density influence value for each said unit square, said first wiring density influence value representing an increment of the wiring density caused by each said wiring line;

(vii) totaling, for each said unit square, the first wiring density influence values for all of the multiple wiring lines to thereby predict the wiring density in each said unit square; and (viii) evaluating the arrangement of the multiple cells based on the predicted wiring density in each said unit square.

10. A computer-readable storage medium as claimed in claim 9, wherein said cell arrangement evaluating program further instructs the computer to carry out the following functions of:

when there is any wiring prohibited region in the predetermined region, calculating, for each said unit square, a proportion of an area occupied by the wiring prohibited region to an entire area of each said unit square as a wiring prohibited region occupancy ratio;

multiplying, for each said unit square, the wiring line passing probability within the wiring prohibited region, which probability is assumed to be 1, by the wiring prohibited region occupancy ratio for each said unit square to thereby obtain a second wiring density influence value for each said unit square, said second wiring density influence value representing an increment of the wiring density caused by the wiring prohibited region; and adding the second wiring density influence value for each said unit square to the wiring density in each said unit square to thereby modify the wiring density in each said unit square.

11. A computer-readable storage medium as claimed in claim 9, wherein said cell arrangement evaluating program further instructs the computer to carry out the following functions of:

calculating, for each said unit square, a proportion of an area occupied by a selected one of the multiple cells to an entire area of each said unit square as a cell occupancy ratio;

multiplying, for each said unit square, the wiring line passing probability within the selected cell, which probability is previously determined for the selected cell, by the cell occupancy ratio for each said unit square to thereby obtain a third wiring density influence value for each said unit square, said third wiring density influence value representing an increment of the wiring density caused by the selected cell; and adding the third wiring density influence value for each said unit square to the wiring density in each said unit square to thereby modify the wiring density in each said unit square.

12. A device for interactively arranging a multiplicity of cells, whose interconnection relationship is previously determined, in a predetermined region, which has been divided into a first grid by units of a minimum pitch of wiring, in designing a circuit so that a multiplicity of wiring lines are routed along the first grid in the predetermined region to interconnect between the arranged multiple cells in accordance with the interconnection relationship in a subsequent stage of the circuit designing, said device comprising:

a cell arranging unit for arranging the multiple cells in the predetermined region based on the interconnect relationship of the multiple cells;

a display unit for displaying various data regarding the cell arranging by said cell arranging unit, said data including a result of the arrangement of the multiple cells in said predetermined region;

a display control unit for controlling the display of the various data by said display unit;

an input unit for inputting to said cell arranging unit various instructions regarding the cell arranging by said cell arranging unit in response to the various data displayed by said display unit, thereby allowing the cell arranging to be carried out in the interactive manner; and a wiring density predicting unit for predicting a wiring density among the multiple cells based on the result of the arrangement of the multiple cells by said cell arranging unit, said wiring density predicting unit includes:

(i) a dividing section for dividing the predetermined region into a second grid of unit squares, each of the unit squares being a unit of prediction of the wiring density, (ii) a selection section for selecting, for each of the multiple wiring lines, a pair of cells having a pair of pins to be interconnected by each said wiring line from the multiple cells arranged by said cell arrangement processing unit, (iii) a rectangular region setting section for setting a rectangular region whose one diagonal pair of vertexes is the pair of pins of the cell pair selected by said selection section for each said wiring line, (iv) a wiring line passing probability calculating section for calculating, for each of intersections of the first grid which are situated within the rectangular region, a probability that each said wiring line is routed to pass through each said intersection within the rectangular region as a wiring line passing probability, assuming that the wiring line passing probability is uniform at every intersection within the rectangular region, (v) a rectangular region occupancy ratio calculating section for calculating, for each of the unit squares of the second grid, a proportion of an area occupied by the rectangular region to an entire area of each said unit square as a rectangular region occupancy ratio, (vi) a first influence-value calculating section for multiplying, for each said unit square, the wiring line passing probability for any intersection within the rectangular region by the rectangular region occupancy ratio for each said unit square to thereby calculate a first wiring density influence value for each said unit square, said first wiring density influence value representing an increment of the wiring density caused by each said wiring line, and (vii) a wiring density calculating section for totaling, for each said unit square, the first wiring density influence values for all of the multiple wiring lines to thereby calculate the wiring density in each said unit square, said display control unit being operable to control said display unit to display at least part of the unit squares to the second grid while varying a display status of each of the unit squares displayed on said display unit according to the wiring density predicted for each of the displayed unit square by said wiring density predicting unit.

13. A cell arranging device as claimed in claim 12, wherein said wiring density predicting unit further includes:

a wiring prohibited region occupancy ratio calculating section for, when there is any wiring prohibited region in the predetermined region, calculating a proportion, for each said unit square, of an area occupied by the wiring prohibited region to an entire area of each said unit square as a wiring prohibited region occupancy ratio; and a second influence value calculating section for multiplying, for each said unit square, the wiring line passing probability within the wiring prohibited region, which probability is assumed to be 1, by the wiring prohibited region occupancy ratio for each said unit square to thereby obtain a second wiring density influence value for each said unit square, said second wiring density influence value representing an increment of the wiring density caused by the wiring prohibited region;

said wiring density calculating section being operable to modify the calculated wiring density in each said unit square by adding the second wiring-density influence value for each said unit square to the predicted wiring density in each said unit square.

14. A cell arranging device as claimed in claim 12, wherein said wiring-density predicting unit further includes:

a cell occupancy ratio calculating section for calculating, for each said unit square, a proportion of an area occupied by a selected one of the multiple cells to an entire area of each said unit square as a cell occupancy ratio; and a third influence value calculating section for multiplying, for each said unit square, the wiring line passing probability within the selected cell, which probability is previously determined for the selected cell, by the cell occupancy ratio for each said unit square to thereby obtain a third wiring density influence value for each said unit square, said third wiring density influence value representing an increment of the wiring density caused by the selected cell;

said wiring density calculating section being operable to modify the calculated wiring density in each said unit square by adding the third wiring density influence value for each said unit square to the predicted wiring density in each said unit square.

15. A cell arranging device as claimed in claim 12, further comprising:

a cell library, connected to said wiring density predicting unit, for registering representative information regarding each pin of the multiple cells, said rectangular region setting section being operable to locate the pair of pins of the two cells in order to set the rectangular region, using representative information regarding said pair of pins registered in said cell library.

16. A cell arranging device as claimed in claim 12, further comprising:

a cell library, connected to said wiring density predicting unit, for registering several bits of information regarding each pin of the multiple cells, said rectangular region setting section being operable to locate the pair of pins of the two cells in order to set the rectangular region, selectively using (a) in a normal mode, all bits of information regarding said pair of pins registered in said cell library and (b) in a high-speed mode, representative bits selected from the information regarding said pair of pins registered in said cell library.

17. A cell arranging device as claimed in claim 12, wherein said rectangular region setting section is operable to adjust a size of said rectangular region based on a bypassing rate of a wiring route.

18. A cell arranging device as claimed in claim 12, wherein said first influence value calculating section is operable to adjust said first wiring density influence value based on a width of each said wiring line according to a variety of each said wiring line.

19. A cell arranging device as claimed in claim 14, wherein when one or more cells in the multiple cells are rearranged by said cell arranging unit after said wiring density predicting unit has predicted the wiring density among the multiple cells, said wiring density predicting unit is operable to subtract, for each of the unit squares associated with the rearranged cells, the first and third wiring density influence values calculated for the rearranged cells before the rearrangement from the wiring density in each of the associated unit squares before the rearrangement, to calculate, for each said associated unit square, first and third wiring density influence values for the rearranged cells after the rearrangement by said selecting section, said rectangular region setting section, said wiring line passing probability calculating section, said rectangular region occupancy ratio calculating section, said first influence value calculating section, said cell occupancy ratio calculating section and said third influence value calculating section, and to add, for each said associated unit square, said calculated first and third wiring density influence values after the rearrangement to a result of said subtraction to thereby obtain a wiring density in each said associated unit square after the rearrangement by said wiring density calculating section.

20. A cell arranging device as claimed in claim 12, wherein if at least one of the unit squares is selected on said display unit by operating said input unit, said display control unit controls said display unit to display cells existing in said selected unit square, wiring lines passing through said selected unit square and cells connected to said wiring lines with emphasis.

21. A cell arranging device as claimed in claim 20, wherein if a list display flag is set ON, said display control unit controls said display unit to display information regarding said emphatically-displayed cells and wiring lines as a list.

22. A cell arranging device as claimed in claim 12, wherein if an automatic display flag is set ON, said display control unit controls said display unit to automatically display cells existing in unit squares each having a wiring density equal to a preset reference value or higher, wiring lines passing through said unit squares and cells connected to said wiring lines with emphasis, and to automatically display information regarding said emphatically-displayed cells and wiring lines as a list.

23. A cell arranging device as claimed in claim 12, wherein a size of each said unit square is inputted as a control parameter from said input unit in an interactive manner.

24. A cell arranging device as claimed in claim 14, wherein said wiring line passing probability within the selected cell is inputted as a control parameter from said input unit in an interactive manner.

25. A cell arranging device as claimed in claim 16, wherein a mode specifying flag for specifying one of said normal mode and said high-speed mode is inputted as a control parameter from said input unit in an interactive manner.

26. A cell arranging device as claimed in claim 17, wherein said bypassing rate of said wiring route is inputted as a control parameter from said input unit in an interactive manner.

27. A cell arranging device as claimed in claim 18, wherein an amount of said adjusting based on the width of each said wiring line according to the variety of each said wiring line is inputted as a control parameter from said input unit in an interactive manner.

28. A cell arranging device as claimed in claim 21, wherein said list display flag is inputted as a control parameter from said input unit in an interactive manner.

29. A cell arranging device as claimed in claim 22, wherein said automatic display flag and said preset reference value are inputted as control parameters from said input unit in an interactive manners.

30. A method for arranging a multiplicity of cells, whose interconnection relationship is previously determined, in a predetermined region, which has been divided into a first grid by units of a minimum pitch of wiring, in designing a circuit so that a multiplicity of wiring lines are routed along the first grid in the predetermined region to interconnect between the arranged multiple cells in accordance with the interconnection relationship in a subsequent stage of the circuit designing, said method comprising the steps of:

arranging the multiple cells in the predetermined region based on the interconnect relationship of the multiple cells;

predicting a wiring density among the multiple cells based on the result of the arrangement of the multiple cells, said predicting step including:

(i) dividing the predetermined region into a second grid of unit squares, each of the unit squares being a unit of prediction of the wiring density, (ii) selecting, for each of the multiple wiring lines, two cells having a pair of pins to be interconnected by each said wiring line from the arranged multiple cells, (iii) setting a rectangular region whose one diagonal pair of vertexes is the pair of pins of the two cells selected for each said wiring line, (iv) calculating, for each of intersections of the first grid which are situated within the rectangular region, a probability that each said wiring line is routed to pass through each said intersection within the rectangular region as a wiring line passing probability, assuming that the wiring line passing probability is uniform at every intersection within the rectangular region, (v) calculating, for each of the unit squares of the second grid, a proportion of an area occupied by the rectangular region to an entire area of each said unit square as a rectangular region occupancy ratio, (vi) multiplying, for each said unit square, the wiring line passing probability for any intersection within the rectangular region by the rectangular region occupancy ratio for each said unit square to thereby obtain a first wiring density influence value for each said unit square, said first wiring density influence value representing an increment of the wiring density caused by each said wiring line, and (vii) totaling, for each said unit square, the first wiring density influence values for all of the multiple wiring lines to thereby predict the wiring density in each said unit square; and evaluating the arrangement of the multiple cells based on the predicted wiring density in each said unit square.

31. A cell arranging method as claimed in claim 30, wherein said predicting step further includes:

when there is any wiring prohibited region in the predetermined region, calculating, for each said unit square, a proportion of an area occupied by the wiring prohibited region to an entire area of each said unit square as a wiring prohibited region occupancy ratio;

multiplying, for each said unit square, the wiring line passing probability within the wiring prohibited region, which probability is assumed to be 1, by the wiring prohibited region occupancy ratio for each said unit square to thereby obtain a second wiring density influence value for each said unit square, said second wiring density influence value representing an increment of the wiring density caused by the wiring prohibited region; and adding the second wiring density influence value for each said unit square to the wiring density in each said unit square to thereby modify the wiring density in each said unit square.

32. A cell arranging method as claimed in claim 30, wherein said predicting step further includes:

calculating, for each said unit square, a proportion of an area occupied by a selected one of the multiple cells to an entire area of each said unit square as a cell occupancy ratio;

multiplying, for each said unit square, the wiring line passing probability within the selected cell, which probability is previously determined for the selected cell, by the cell occupancy ratio for each said unit square to thereby obtain a third wiring density influence value for each said unit square, said third wiring density influence value representing an increment of the wiring density caused by the selected cell; and adding the third wiring density influence value for each said unit square to the wiring density in each said unit square to thereby modify the wiring density in each said unit square.

33. A computer-readable storage medium storing a program for arranging a multiplicity of cells, whose interconnection relationship is previously determined, in a predetermined region, which has been divided into a first grid by units of a minimum pitch of wiring, in designing a circuit so that a multiplicity of wiring lines are routed along the first grid of the predetermined region to interconnect between the arranged multiple cells in accordance with the interconnection relationship in a subsequent stage of the circuit designing, wherein said cell arranging program instructs a computer to carry out the following functions of:

arranging the multiple cells in the predetermined region based on the interconnect relationship of the multiple cells;

predicting a wiring density among the multiple cells based on the result of the arrangement of the multiple cells, said predicting function including:
  (i) dividing the predetermined region into a second grid of unit squares, each of the unit squares being a unit of prediction of the wiring density,
  (ii) selecting, for each of the multiple wiring lines, two cells having a pair of pins to be interconnected by each said wiring line from the arranged multiple cells,
  (iii) setting a rectangular region whose one diagonal pair of vertexes is the pair of pins of the two cells selected for each said wiring line,
  (iv) calculating, for each of intersections of the first grid which are situated within the rectangular region, a probability that each said wiring line is routed to pass through each said intersection within the rectangular region as a wiring line passing probability, assuming that the wiring line passing probability is uniform at every intersection within the rectangular region,
  (v) calculating, for each of the unit squares of the second grid, a proportion of an area occupied by the rectangular region to an entire area of each said unit square as a rectangular region occupancy ratio,
  (vi) multiplying, for each said unit square, the wiring line passing probability for any intersection within the rectangular region by the rectangular region occupancy ratio for each said unit square to thereby obtain a first wiring density influence value for each said unit square, said first wiring density influence value representing an increment of the wiring density caused by each said wiring line, and
  (vii) totaling, for each said unit square, the first wiring density influence values for all of the multiple wiring lines to thereby predict the wiring density in each said unit square; and evaluating the arrangement of the multiple cells based on the predicted wiring density in each said unit square.

34. A computer-readable storage medium as claimed in claim 33, wherein said cell arranging program further instructs the computer to carry out, as sub-functions of said predicting function, the following:

when there is any wiring prohibited region in the predetermined region, calculating, for each said unit square, a proportion of an area occupied by the wiring prohibited region to an entire area of each said unit square as a wiring prohibited region occupancy ratio;

multiplying, for each said unit square, the wiring line passing probability within the wiring prohibited region, which probability is assumed to be 1, by the wiring-prohibited region occupancy ratio for each said unit square to thereby obtain a second wiring density influence value for each said unit square, said second wiring density influence value representing an increment of the wiring density caused by the wiring prohibited region; and adding the second wiring density influence value for each said unit square to the wiring density in each said unit square to thereby modify the wiring density in each said unit square.

35. A computer-readable storage medium as claimed in claim 33, wherein said cell arranging program further instructs the computer to carry out, as sub-functions of said predicting function, the following:

calculating, for each said unit square, a proportion of an area occupied by a selected one of the multiple cells to an entire area of each said unit square as a cell occupancy ratio;

multiplying, for each said unit square, the wiring line passing probability within the selected cell, which probability is previously determined for the selected cell, by the cell occupancy ratio for each said unit square to thereby obtain a third wiring density influence value for each said unit square, said third wiring density influence value representing an increment of the wiring density caused by the selected cell; and adding the third wiring density influence value for each said unit square to the wiring density in each said unit square to thereby modify the wiring density in each said unit square.

* * * * *